(12) United States Patent
Li et al.

(10) Patent No.: US 11,387,259 B2
(45) Date of Patent: Jul. 12, 2022

(54) ARRAY SUBSTRATE, MANUFACTURING METHOD THEREOF, AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Pan Li, Beijing (CN); Jianbo Xian, Beijing (CN); Chunping Long, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/280,795

(22) PCT Filed: Jul. 21, 2020

(86) PCT No.: PCT/CN2020/103313
§ 371 (c)(1),
(2) Date: Mar. 26, 2021

(87) PCT Pub. No.: WO2021/212676
PCT Pub. Date: Oct. 28, 2021

(65) Prior Publication Data
US 2022/0123028 A1    Apr. 21, 2022

(30) Foreign Application Priority Data

Apr. 24, 2020 (CN) .......................... 202010330332.1

(51) Int. Cl.
*H01L 27/12* (2006.01)
*H01L 51/52* (2006.01)

(52) U.S. Cl.
CPC ...... *H01L 27/1218* (2013.01); *H01L 27/1248* (2013.01); *H01L 27/1262* (2013.01); *H01L 51/5253* (2013.01)

(58) Field of Classification Search
CPC ............. H01L 27/1218; H01L 27/1248; H01L 27/1262; H01L 51/5253
See application file for complete search history.

(56) References Cited

U.S. PATENT DOCUMENTS

| 6,172,721 B1 * | 1/2001 | Murade ................. G02F 1/1368 438/670 |
| 2001/0038485 A1 * | 11/2001 | Hirabayashi ...... G02F 1/136209 359/248 |

(Continued)

FOREIGN PATENT DOCUMENTS

| CN | 101779280 A | 7/2010 |
| CN | 104008963 A | 8/2014 |

(Continued)

OTHER PUBLICATIONS

Pre-review Opinion for Chinese Application No. 202010330332.1 (Pre-trial No. BEIJ20201000423), dated Apr. 16, 2020, 4 Pages.

(Continued)

*Primary Examiner* — Mohsen Ahmadi
(74) *Attorney, Agent, or Firm* — Brooks Kushman P.C.

(57) ABSTRACT

The present disclosure provides an array substrate, a manufacturing method thereof, and a display device. The array substrate includes a base substrate, and a first functional layer and a second functional layer laminated one on another on the base substrate. The first functional layer forms a level-different region on the base substrate, and the second functional layer covers the level-different region. A portion of the first functional layer at the level-different region is provided with a target gradient angle, the target gradient angle is a maximum gradient angle when the second func- (Continued)

tional layer has a predetermined thickness, and the predetermined thickness is a thickness when a functional requirement of the second functional layer has been met and the second functional layer is not broken at the level-different region.

20 Claims, 11 Drawing Sheets

(56) References Cited

U.S. PATENT DOCUMENTS

| | | |
|---|---|---|
| 2004/0018749 A1 | 1/2004 | Dorfman |
| 2009/0041989 A1 | 2/2009 | Clevenger et al. |
| 2014/0242807 A1 | 8/2014 | Bedell et al. |
| 2016/0246097 A1* | 8/2016 | Guo .................... G02F 1/13394 |
| 2019/0333972 A1* | 10/2019 | Ding .................... H01L 27/3281 |
| 2021/0020864 A1* | 1/2021 | Huang .................... H01L 51/56 |
| 2022/0045300 A1* | 2/2022 | He .................... H01L 27/3246 |

FOREIGN PATENT DOCUMENTS

| | | |
|---|---|---|
| CN | 107579081 A | 1/2018 |
| CN | 109873025 A | 6/2019 |
| CN | 209447790 U | 9/2019 |
| CN | 111244117 A | 6/2020 |

OTHER PUBLICATIONS

First Office Action for Chinese Application No. 202010330332.1, dated Jun. 16, 2020, 5 Pages.

\* cited by examiner

ARRAY SUBSTRATE, MANUFACTURING METHOD THEREOF, AND DISPLAY DEVICE

CROSS-REFERENCE TO RELATED APPLICATIONS

This application is the U.S. national phase of PCT Application No. PCT/CN2020/103313 filed on Jul. 21, 2020, which claims priority to Chinese Patent Application No. 202010330332.1 filed on Apr. 24, 2020, which are incorporated herein by reference in their entireties.

TECHNICAL FIELD

The present disclosure relates to the field of display technology, in particular to an array substrate, a manufacturing method thereof, and a display device.

BACKGROUND

Along with the continuous development of the display technology, more and more types of display products have emerged. Currently, commonly-used display products include Liquid Crystal Display (LCD) product, and Organic Light-Emitting Diode (OLED) display products. Each of these display products includes an array substrate, and a circuit structure is formed on the array substrate for providing a driving signal for the display product.

Usually, the circuit structure includes a thin film transistor (TFT), a capacitor, an electrode structure and a signal line. At least a part of functional layers in the TFT, the capacitor, the electrode structure and the signal line are functional patterns, and the functional patterns form level-different regions in the array substrate. In this regard, the functional layer covering the level-different region in the array substrate needs to cross a step in the level-different region, and thereby the functional layer has a risk of being easily broken at the step.

In the related art, in order to prevent the functional layer from being broken at the step, usually a thickness of the functional layer may be increased. However, in this processing mode, it is adverse to the application of the array substrate to a thin display product.

SUMMARY

An object of the present disclosure is to provide an array substrate, a manufacturing method thereof, and a display device, so as to solve the above problem.

In a first aspect, the present disclosure provides in some embodiments an array substrate, including a base substrate, and a first functional layer and a second functional layer laminated one on another on the base substrate. The first functional layer forms a level-different region on the base substrate, and the second functional layer covers the level-different region. A portion of the first functional layer at the level-different region is provided with a target gradient angle, the target gradient angle is a maximum gradient angle when the second functional layer has a predetermined thickness, and the predetermined thickness is a thickness when a functional requirement of the second functional layer has been met and the second functional layer is not broken at the level-different region.

In a possible embodiment of the present disclosure, the target gradient angle of the first functional layer and the predetermined thickness of the second functional layer meet $\tan(a)-1 \leq N(x-y)/y \leq \tan(a)+1$, where $N = z \times W \times K_{IC}$, $z$ is a constant, $W$ is a predetermined value, $K_{IC}$ is a fracture toughness parameter of the second functional layer, $x$ is the predetermined thickness of the second functional layer, $y$ is a thickness of a portion of the first functional layer at the level-differential region, and $a$ is the target gradient angle of the first functional layer.

In a possible embodiment of the present disclosure, the first functional layer includes a first functional pattern, and the first functional pattern forms a first level-different region on the base substrate. The second functional layer includes a first functional film layer and a second functional film layer, the first functional film layer is arranged at a side of the first functional pattern away from the base substrate, the second functional film layer is arranged at a side of the first functional film layer away from the base substrate, the first functional film layer and the second functional film layer both cover the first level-different region, and the first functional film layer has a fracture toughness parameter approximately same as the second functional film layer. Each of the first functional film layer and the second functional film layer has a uniform thickness. A portion of the first functional pattern at the first level-different region is provided with a first target gradient angle, the first target gradient angle is a maximum gradient angle when each of the first functional film layer and the second functional film layer has a first predetermined thickness, and the first predetermined thickness is a sum of the thickness of the first functional film layer and the thickness of the second functional film layer when a functional requirement of each of the first functional film layer and the second functional film layer has been met and each of them is not broken at the first level-different region.

In a possible embodiment of the present disclosure, the first functional layer further includes a second functional pattern arranged at a same layer and made of a same material as the first functional pattern, the second functional pattern forms a second level-different region, and the first functional film layer covers the second level-different region. A portion of the second functional pattern at the second level-different region is provided with a second target gradient angle, the second target gradient angle is a maximum gradient angle when the first functional film layer has a second predetermined thickness, the second predetermined thickness is a thickness when a functional requirement of the first functional film layer has been met and the first functional film layer is not broken at the second level-different region, and the second target gradient angle is smaller than the first target gradient angle.

In a possible embodiment of the present disclosure, the first functional layer further includes a third functional pattern arranged at a side of the first functional film layer away from the base substrate, the third functional pattern forms a third level-different region on the base substrate, and the second functional film layer covers the third level-different region. A portion of the third functional pattern at the third level-different region is provided with a third target gradient angle, the third target gradient angle is a maximum gradient angle when the second functional film layer has a third predetermined thickness, the third predetermined thickness is a thickness when a functional requirement of the second functional film layer has been met and the second functional film layer is not broken at the third level-different region, and the third target gradient angle is greater than the second target gradient angle and smaller than the first target gradient angle.

In a possible embodiment of the present disclosure, the first functional layer includes a fourth functional pattern, and the fourth functional pattern forms at least two fourth level-different regions arranged sequentially on the base substrate in a direction away from the base substrate. The second functional layer includes a planarization layer arranged at a side of the fourth functional pattern away from the base substrate and covering the entire fourth functional pattern. A portion of the fourth functional pattern at each fourth level-different region is provided with a fourth target gradient angle, the fourth target gradient angle is a maximum gradient angle when a first portion of the planarization layer at the fourth level-different region corresponding to the fourth target gradient angle has a fourth predetermined thickness, the fourth predetermined thickness is a minimum thickness when a functional requirement of the first portion has been met and the first portion is not broken at the fourth level-different region.

In a possible embodiment of the present disclosure, the first functional layer includes a first functional pattern, and the first functional pattern forms a first level-different region on the base substrate. The second functional layer includes a first functional film layer and a second functional film layer, the first functional film layer is arranged at a side of the first functional pattern away from the base substrate, the second functional film layer is arranged at a side of the first functional film layer away from the base substrate, and the first functional film layer and the second functional film layer both cover the first level-different region. The fourth functional pattern is arranged at a side of the second functional film layer away from the base substrate and covers the first level-different region.

In a possible embodiment of the present disclosure, the planarization layer includes a first planarization layer and a second planarization layer, the first functional layer further includes another fourth functional pattern arranged at a side of the first planarization layer away from the base substrate and forming another fourth level-different region on the base substrate, a portion of the other fourth functional pattern at the other fourth level-different region is provided with another fourth target gradient angle, and the second planarization layer covers the other fourth functional pattern.

In a possible embodiment of the present disclosure, the first functional layer includes a fifth functional pattern and a sixth functional pattern laminated one on another in the direction away from the base substrate. The second functional layer includes a second functional film layer arranged between the fifth functional pattern and the sixth functional pattern, and a planarization layer arranged at a side of the sixth functional pattern away from the base substrate. The second functional film layer is provided with a first via-hole and forms a fifth level-different region at an edge of the first via-hole, and a portion of the second functional film layer at the fifth level-different region is provided with a fifth target gradient angle. The sixth functional pattern is coupled to the fifth functional pattern through the first via-hole, covers the fifth level-different region, and forms a sixth level-different region at a position corresponding to the fifth level-different region. A portion of the sixth functional pattern at the sixth level-different region is provided with a sixth target gradient angle, the sixth target gradient angle is a maximum gradient angle when a second portion of the planarization layer at the sixth level-different region has a sixth predetermined thickness, and the sixth predetermined thickness is a minimum thickness when a functional requirement of the second portion has been met and the second portion is not broken at the sixth level-different region. The fifth target gradient angle is approximately equal to the sixth target gradient angle.

In a possible embodiment of the present disclosure, the first functional layer includes: a seventh functional pattern arranged on the base substrate and forming a seventh level-different region on the base substrate; an eighth functional pattern arranged at a side of the seventh functional pattern away from the base substrate, and including a third portion covering the seventh level-different region, a fourth portion covering the seventh functional pattern other than the seventh level-different region, and a fifth portion not covering the seventh functional pattern; and a planarization layer arranged at a side of the eighth functional pattern away from the base substrate and provided with a second via-hole. An orthogonal projection of the second via-hole onto the base substrate is located within an orthogonal projection of the eighth functional pattern onto the base substrate, the planarization layer forms an eighth level-different region and a ninth level-different region at an edge of the second via-hole, an orthogonal projection of the eighth level-different region onto the base substrate overlaps an orthogonal projection of the fourth portion onto the base substrate, and an orthogonal projection of the ninth level-different region onto the base substrate overlaps an orthogonal projection of the fifth portion onto the base substrate. The second functional layer includes a second functional film layer and a ninth functional pattern, the second functional film layer is arranged between the seventh functional pattern and the eighth functional pattern, the ninth functional pattern is arranged at a side of the planarization layer away from the base substrate and coupled to the eighth functional pattern through the second via-hole, and the ninth functional pattern covers the eighth level-different region and the ninth level-different region and has a uniform thickness. A portion of the planarization layer at the eighth level-different region is provided with an eighth target gradient angle, the eighth target gradient angle is a maximum gradient angle when the ninth functional pattern has an eighth predetermined thickness, and the eighth predetermined thickness is a thickness when a functional requirement of the ninth functional pattern has been met and the ninth functional pattern is not broken at the eighth level-different region. A portion of the planarization layer at the ninth level-different region is provided with a ninth target gradient angle, the ninth target gradient angle is a maximum gradient angle when the ninth functional pattern has a ninth predetermined thickness, and the ninth predetermined thickness is a thickness when a functional requirement of the ninth functional pattern has been met and the ninth functional pattern is not broken at the ninth level-different region.

In a possible embodiment of the present disclosure, an orthogonal projection of the seventh functional pattern onto the base substrate overlaps an orthogonal projection of the eighth functional pattern onto the base substrate at a first overlapping region, the first overlapping region has a first size in a first direction, and a portion of the eighth functional pattern not at the first overlapping region has a second size in the first direction. The ninth functional pattern and the eighth functional pattern form a first contact region, a minimum distance between a boundary of the first contact region and a first end of the eighth functional pattern in the first direction is a first interval, a minimum distance between the boundary of the first contact region and a second end of the eighth functional pattern is a second interval, the first end is arranged opposite to the second end in the first direction, an orthogonal projection of the first end onto the base substrate overlaps the seventh functional pattern, and an orthogonal projection of the second end onto the base substrate does not overlap the seventh functional pattern. A first absolute value corresponding to a difference between the first size and the second size is in direct proportion to a second absolute value corresponding a difference between the first interval and the second interval.

In a possible embodiment of the present disclosure, the second absolute value corresponding to the difference between the first interval and the second interval is in direct proportion to a ratio of the first interval to a first width of the eighth functional pattern in the first direction.

In a possible embodiment of the present disclosure, when the first size is greater than the first interval, the eighth target gradient angle is greater than the ninth target gradient angle, or a difference between the eighth target gradient angle to the ninth target gradient angle is in direct proportion to the first size.

In a possible embodiment of the present disclosure, a difference between the eighth target gradient angle and the ninth target gradient angle is smaller than a seventh target gradient angle of the seventh functional pattern at the seventh level-different region, the seventh target gradient angle is a maximum gradient angle when the second functional film layer has a seventh predetermined thickness, and the seventh predetermined thickness is a thickness when a functional requirement of the second functional film layer has been met and the second functional film layer is not broken at the seventh level-different region.

In a possible embodiment of the present disclosure, the array substrate includes a capacitor structure, the first functional layer includes a first electrode plate of the capacitor structure, and the first electrode plate forms an electrode plate level-different region on the base substrate. The second functional layer includes a dielectric layer arranged at a side of the first electrode plate away from the base substrate and covering the entire first electrode plate. A portion of the first electrode plate at the electrode plate level-different region is provided with an electrode plate target gradient angle, the electrode plate target gradient angle is a maximum gradient angle when the dielectric layer has a tenth predetermined thickness, and the tenth predetermined thickness is a thickness when a functional requirement of the dielectric layer has been met and the dielectric layer is not broken at the electrode plate level-different region. A second electrode plate of the capacitor structure is arranged at a side of the dielectric layer away from the base substrate, an orthogonal projection of the second electrode plate onto the base substrate overlaps an orthogonal projection of the first electrode plate onto the base substrate at a first overlapping region, and the second electrode plate covers the electrode plate level-different region.

In a possible embodiment of the present disclosure, the capacitor structure includes a first capacitor structure, a second capacitor structure and a third capacitor structure, and a capacitance of the first capacitor structure is greater than a capacitance of the second capacitor structure and/or greater than a capacitance of the third capacitor structure. An electrode plate target gradient angle corresponding to a first electrode plate of the first capacitor structure is greater than an electrode plate target gradient angle corresponding to a first electrode plate of the second capacitor structure, and/or greater than an electrode plate target gradient angle corresponding to a first electrode plate of the third capacitor structure.

In a possible embodiment of the present disclosure, a thickness of a first dielectric layer corresponding to the first capacitor structure is smaller than a thickness of a second dielectric layer corresponding to the second capacitor structure, and/or smaller than a thickness of a third dielectric layer corresponding to the third capacitor structure.

In a possible embodiment of the present disclosure, a gradient angle of a portion of a second electrode plate of the first capacitor structure at the corresponding first overlapping region is greater than a gradient angle of a portion of the second electrode plate of the second capacitor structure at the first overlapping region, and/or greater than a gradient angle of a portion of a second electrode plate of the third capacitor structure at the corresponding first overlapping region.

In a possible embodiment of the present disclosure, the first functional layer includes a composite metal pattern, the composite metal pattern includes a first metal sub-pattern, a second metal sub-pattern and a third metal sub-pattern laminated one on another in the direction away from the base substrate, and the first metal sub-pattern is made of a same material as the third metal sub-pattern. The target gradient angle of the first functional layer is in reverse proportion to an etching rate of the third metal sub-pattern when forming the first functional layer through etching.

In a second aspect, the present disclosure provides in some embodiments a display device including the above-mentioned array substrate.

In a third aspect, the present disclosure provides in some embodiments a method for manufacturing the above-mentioned array substrate, including: forming a first functional layer on a base substrate, the first functional layer forming a level-different region on the base substrate, and a portion of the first functional layer at the level-different region being provided with a target gradient angle; and forming a second functional layer at a side of the first functional layer away from the base substrate, the second functional layer covering the level-different region. The target gradient angle is a maximum gradient angle when the second functional layer has a predetermined thickness, and the predetermined thickness is a thickness when a functional requirement of the second functional layer has been met and the second functional layer is not broken at the level-different region. The target gradient angle of the first functional layer and the predetermined thickness of the second functional layer meet $\mathrm{Tan}(a)-1 \leq N(x-y)/y \leq \mathrm{Tan}(a)+1$, where $N=z \times W \times K_{IC}$, $z$ is a constant, $W$ is a predetermined value, $K_{IC}$ is a fracture toughness parameter of the second functional layer, $x$ is the predetermined thickness of the second functional layer, $y$ is a thickness of a portion of the first functional layer at the level-differential region, and $a$ is the target gradient angle of the first functional layer.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

The array substrate, the manufacturing method thereof, display device provided by the embodiments of the present disclosure will be described hereinafter in conjunction with drawings.

A circuit structure is formed in an array substrate of a display product, and usually, it includes a TFT, a capacitor, an electrode structure, and a signal line. At least a part of functional layers in the TFT, the capacitor, the electrode structure and the signal line are functional patterns, the functional patterns may form level-different regions in the array substrate, and each level-different region includes a step with a certain gradient angle formed by the functional pattern. In this regard, the functional layer covering the level-different region in the array substrate needs to cross the step in the level-different region, and thereby the functional layer has a risk of being easily broken at the step.

For example, when the functional pattern includes a conductive metal pattern and the functional layer covering the functional pattern includes an insulation layer, the conductive metal layer may form a level-different region, and the insulation layer needs to cross a step at the level-different region, so the insulation layer has a risk of being easily broken at the step. When the insulation layer is broken, probably a short circuit may occur between a conductive pattern on the insulation layer and the metal pattern, and thereby a yield of the array substrate may be adversely affected.

In the related art, in order to prevent the functional layer from being broken at the step, usually a thickness of the functional layer may be increased. However, in this processing mode, it is adverse to the application of the array substrate to a thin display product.

The following scheme is provided in the embodiments of the present disclosure so as to solve the above-mentioned problem.

Figure 1:
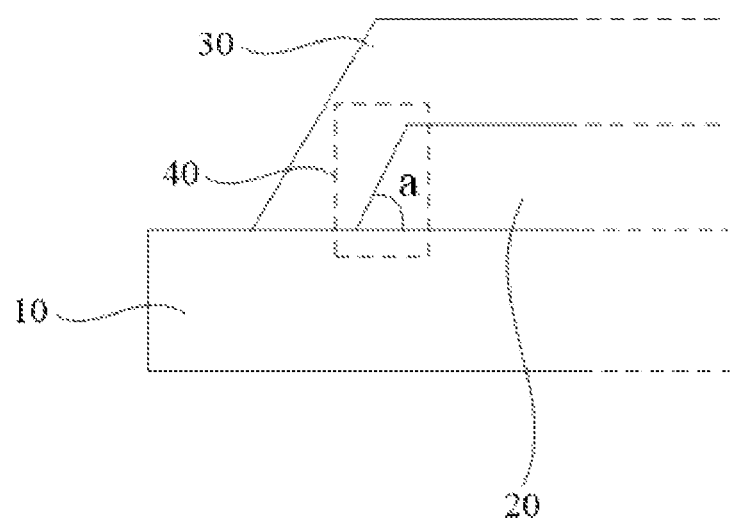
FIG. 1 is a sectional view of an array substrate according to one embodiment of the present disclosure.

As shown in FIG. 1, the present disclosure provides in some embodiments an array substrate, which includes a base substrate 10, and a first functional layer 20 and a second functional layer 30 laminated one on another on the base substrate 10. The first functional layer 20 forms a level-different region 40 on the base substrate 10, and the second functional layer 30 covers the level-different region 40. A portion of the first functional layer 20 at the level-different region 40 is provided with a target gradient angle a, the target gradient angle a is a maximum gradient angle when the second functional layer 30 has a predetermined thickness, and the predetermined thickness is a thickness when a functional requirement of the second functional layer 30 has been met and the second functional layer 30 is not broken at the level-different region 40.

To be specific, the array substrate may include various film layers, e.g., it may include, but not limited to, a first gate metal layer, a gate insulation layer, a second gate metal layer, an interlayer insulation layer, a first source-drain metal layer, a first planarization layer, a second source-drain metal layer, a second planarization layer, and an anode layer laminated to each other.

The first gate metal layer, the second gate metal layer, the first source-drain metal layer, the second source-drain metal layer and the anode layer may each include a plurality of functional patterns, and each functional pattern may form a corresponding level-different region. The gate insulation layer, the interlayer insulation layer, the first planarization layer and the second planarization layer may each be a complete film layer. However, via-holes may be formed in the complete film layer, and a corresponding level-different region may be formed on the complete film layer at a position in proximity to the via-hole.

For example, the first functional layer 20 may include one or more of the plurality of functional patterns, or the complete film layer with the via-holes, and identically, the second functional layer 30 may include one or more of the plurality of functional patterns, or the complete film layer with the via-holes, as long as the one or more of the plurality of functional patterns and the complete film-layer with the via-holes cover the level-different regions.

It should be appreciated that, the level-different region formed by the functional pattern may be located at a peripheral portion of the functional pattern, or at a middle portion of the functional pattern surrounded by the peripheral portion. More specifically, usually, the level-different region at the peripheral portion of the functional pattern may be formed between the peripheral portion and a plane where the peripheral portion is located, and the level-different region at the middle portion of the functional pattern may be formed at the middle portion, or between the middle portion and the peripheral portion when the middle portion covers an uneven region (e.g., a level-different region formed by a bottom-layer pattern).

In addition, a specific range of the level-different region may be set according to the practical need. For example, the level-different region may be a region where a step formed by the functional pattern is located, or a region within a predetermined range with the step formed by the functional pattern as a center.

In addition, for the predetermined thickness which is a thickness when the functional requirement of the second functional layer 30 has been met and the second functional layer 30 is not broken at the level-different region, the following explanation will be given. The expression "the functional requirement of the second functional layer 30 has been met" refers to that the second functional layer 30 needs to be provided with a thickness sufficiently large to meet the its functional requirement. For example, when the second functional layer 30 is an insulation layer, it needs to be provided with a thickness sufficiently large to meet the requirement on insulation performance; when the insulation layer serves a dielectric layer in a capacitor, it needs to be provided with a thickness sufficiently large to meet the requirement on a capacitance of the capacitor; and when the second functional layer 30 is a planarization layer, it needs to be provided with a thickness sufficiently large to meet the requirement on planarization. It should be appreciated that, when the second functional layer 30 has a uniform thickness in a direction perpendicular to its extension direction and the second functional layer 30 cover a plurality of first functional patterns with different gradient angles at a same layer, it is necessary to ensure that the second functional layer 30 is not broken at the level-different regions formed by the first functional patterns.

Factors associated with a breaking risk of the second functional layer 30 may include a size of a gradient angle of a step which the second functional layer 30 needs to cross at the level-different region, and the thickness of the second functional layer 30. When the step is provided with a larger gradient angle, it is able to arrange the functional pattern in a more compact manner, thereby to apply the array substrate to a high-resolution display product more conveniently. However, when the gradient angle of the step is larger, a breaking risk of the functional layer with a certain thickness at the step may be larger too. In the case that the functional requirement of the second functional layer 30 has been met, when the thickness of the second functional layer 30 is larger, the second functional layer 30 may be less likely to be broken at the level-different region. However, when the thickness is too large, it may be adverse to the application of the array substrate in a thin display product. Hence, based on the above factors, an appropriate relationship between the thickness of the second functional layer 30 and the gradient angle of the step which the second functional layer crosses may be determined, so as to provide a maximum gradient angle and the thinnest second functional layer 30 while ensuring that the second functional layer 30 is not broken.

According to the array substrate in the embodiments of the present disclosure, the portion of the first functional layer 20 at the level-different region may be provided with the target gradient angle, the target gradient angle may be a maximum gradient angle when the second functional layer has the predetermined thickness, and the predetermined thickness may be a thickness when the functional requirement of the second functional layer has been met and the second functional layer is not broken at the level-different region. In this regard, it is able to, while providing the first functional layer 20 with a maximum gradient angle, provide the second functional layer 30 with a minimum thickness when the functional requirement of the second functional layer 30 has been met and the second functional layer 30 is not broken at the level-different region. As a result, in the case of ensuring that the functional layer is not broken, it is able to provide the thinnest second functional layer 30 with a maximum gradient angle, thereby to apply the array substrate to a thin and high-resolution display product, improve the yield of the array substrate, and reduce the material cost.

In a possible embodiment of the present disclosure, the target gradient angle of the first functional layer 20 and the predetermined thickness of the second functional layer 30 may meet $\mathrm{Tan}(a)-1 \le N(x-y)/y \le \mathrm{Tan}(a)+1$ (1), where $N=z \times W \times K_{IC}$, z is a constant, W is a predetermined value, $K_{IC}$ is a fracture toughness parameter of the second functional layer 30, x is the predetermined thickness of the second functional layer 30, y is a thickness of a portion of the first functional layer 20 at the level-differential region, and a is the target gradient angle of the first functional layer 20.

To be specific, toughness is a physics concept, and it is used to represent a material's capability of absorbing energy during elastic deformation and fracture. The better the toughness is, the smaller the probability of brittle fracture is. As an important parameter in material science and metallurgy, the toughness refers to a resistance of a material against fracture when a force is applied to the material and the material is deformed, and it is defined as a ratio of energy absorbed by the material before the fracture and a volume of the material.

Fracture toughness is a measure for a fast crack propagation capability, and also a toughness parameter of a material against brittle failure. It is irrelevant to a size and a shape of a crack as well as an external stress, and it is an inherent characteristic of the material, i.e., it is merely associated with the material itself, and a thermal processing and machining process. Usually, the fracture toughness is represented by energy absorbed by an object before fracture, or the work that has been done on the object before fracture, e.g., an area in a stress-strain curve. A tough material has large fracture toughness due to a large breaking elongation value, and a brittle material usually has small fracture toughness.

The fracture toughness may be affected by external factors and internal factors. The external factors may include a size of a cross section of a sheet material or component, a temperature under a service condition, and a strain rate. The fracture toughness of the material may decrease gradually along with an increase in the size of the cross section of the sheet material or component, and may finally be maintained at a stable minimum value, i.e., the plane strain fracture toughness $K_{IC}$. This is a conversion process from a plane stress state to a plane strain state.

The fracture toughness may change along with the temperature in a similar way as impact toughness. Along with a decrease in the temperature, the fracture toughness may dramatically decrease within a certain temperature range, and when the temperature is lower than the temperature range, the fracture toughness is maintained at a lower level with a very small value, i.e., at this time the fracture toughness may change little even when the temperature decreases.

Regarding the fracture toughness of the material at a high temperature, Hahn and Rosenfied have proposed the empirical formula:

$$K_{IC} = n\left(\frac{2E\sigma_S\varepsilon_f}{3}\right)^{\frac{1}{2}}, \quad (2)$$

where n represents a strain hardening exponent of the material at the high temperature, E represents an elastic modulus of the material at the high temperature (in MPa), $\sigma_S$ represents yield strength of the material at the high temperature (in MPa), and $\varepsilon_f$ represents a true fracture stress in single tension at the high temperature.

The fracture toughness may be affected by the strain rate in a similar way as the temperature, and the influence caused by the increase in the strain rate may be consistent with the influence caused by the decrease in the temperature.

The internal factors may include a material composition and an internal organization. Material strength is a macroscopic expression of the material composition and the internal organization as a whole. In terms of mechanics rather than metallurgy, the fracture toughness is always discussed on the basis of a change of the material strength at first, and the fracture toughness of the material may be estimated approximately as long as the material strength has been acquired.

Figure 15:
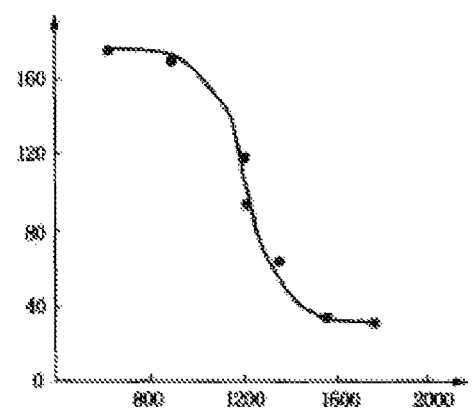
FIG. 15 is a curve diagram of a relationship between fracture toughness and yield strength according to one embodiment of the present disclosure.

FIG. 15 shows a relationship between the fracture toughness of AISI 4340 steel (40CrNiMo) and the yield strength acquired after quenching and tempering, where an abscissa represents the yield strength $\sigma_S$ in MPa, and an ordinate represents the fracture toughness parameter $K_{IC}$ in $MPa \cdot m^{1/2}$. It can be seen that, the fracture toughness increases gradually along with a decrease in the yield strength of the material. This experimental result is typical, and this change rule may be applied to most of the low alloy steel, even the maraging steel (18Ni), merely with a larger fracture toughness value under the same strength.

The fracture toughness is measured in $J/m^3$ in International System of Units, and in poundal-force per square inch in imperial unit. The unit of toughness is $MPa \cdot m^{1/2}$.

In the above formula (1), z may be a constant, and it may have a value within the range of 1 to 1.1 (with the endpoint values inclusive) in $Mpa^-1 \cdot m^-\frac{1}{2}$. Tan(a) may be a tangent function of the target gradient angle a. W may be an empirical value related to a formation process of the second functional layer and a specific interlayer structure, and it may have a value within the range of 0.4 to 2.2 (with the endpoint values inclusive).

For example, when the second functional layer 30 is an inorganic layer, a value of N may be approximately within the range of 0.9 to 1.1 (with the endpoint values inclusive), and when the second functional layer 30 is an organic layer, the value of N may be approximately within the range of 0.8 to 0.9 (with the endpoint values inclusive).

In addition, the thickness of the portion of the first functional layer 20 at the level-different region may be just a height of the step of the first functional layer 20 at the level-different region in a direction perpendicular to the base substrate 10.

According to the array substrate in the embodiments of the present disclosure, through analyzing the material characteristics, the formation process, the thickness and the fracture toughness of the first functional layer 20 forming the level-different region and the second functional layer 30 covering the level-different region, it is able to acquire the internal relationship between the thickness of the second functional layer 30 and the gradient angle of the first functional layer 20 at the level-different region, and provide the first functional pattern 201 with a maximum gradient angle while preventing the second functional layer 30 from being broken at the level-different region, thereby to apply the array substrate to the thin and high-resolution display product in a better manner, improve the yield of the array substrate and reduce the material cost.

Figure 2:
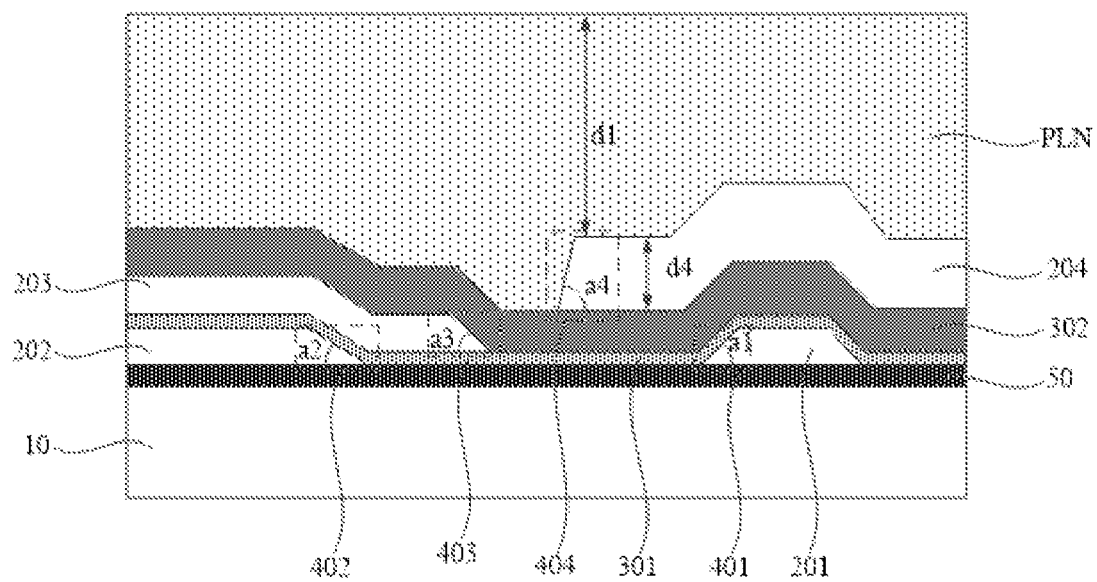
FIG. 2 is another sectional view of the array substrate according to one embodiment of the present disclosure.

As shown in FIG. 2, in some embodiments of the present disclosure, the first functional layer may include a first functional pattern 201, and the first functional pattern 201 may form a first level-different region 401 on the base substrate 10.

The second functional layer 30 may include a first functional film layer 301 and a second functional film layer 302, the first functional film layer 301 may be arranged at a side of the first functional pattern 201 away from the base substrate 10, the second functional film layer 302 may be arranged at a side of the first functional film layer 301 away from the base substrate 10, the first functional film layer 301 and the second functional film layer 302 may both cover the first level-different region 401, and the first functional film layer 301 may have a fracture toughness parameter approximately identical to the second functional film layer 302.

The first functional film layer 301 may have a uniform thickness in a direction perpendicular to an extension direction of the first functional film layer 301, and the second functional film layer 302 may have a uniform thickness in a direction perpendicular to an extension direction of the second functional film layer 302.

A portion of the first functional pattern 201 at the first level-different region 401 may be provided with a first target gradient angle a1, the first target gradient angle a1 may be a maximum gradient angle when each of the first functional film layer 301 and the second functional film layer 302 has a first predetermined thickness, and the first predetermined thickness may be a sum of the thickness of the first functional film layer 301 and the thickness of the second functional film layer 302 when a functional requirement of each of the first functional film layer 301 and the second functional film layer 301 has been met and each of them is not broken at the first level-different region 401.

To be specific, each of the first functional layer 20 and the second functional layer 30 may be of various structures. For example, the first functional layer 20 may include the first functional pattern 201, and the second functional layer 30 may include the first functional film layer 301 arranged at a surface of the first functional pattern 201 away from the base substrate 10 and a second functional film layer 302 arranged at a surface of the first functional film layer 301 away from the base substrate 10. The first functional pattern 201 may be a first gate metal pattern in a first gate metal layer, and a first gate insulation layer 50 may be arranged between the first gate metal pattern and the base substrate 10. The first functional film layer 301 may be a second gate insulation layer, and the second functional film layer 302 may be an interlayer insulation layer (ILD layer).

The second gate insulation layer and the interlayer insulation layer may each be made of silicon nitride or silicon oxide, or a combination thereof. In other words, the second gate insulation layer and the interlayer insulation layer may be made of a same material through a same manufacturing process (e.g., plasma-enhanced chemical vapor deposition), so the fracture toughness parameter of the first functional film layer 301 may be approximately identical to that of the second functional film layer 302.

When calculating the gradient angle of the first functional pattern 201, the first functional film layer 301 has a uniform thickness in the direction perpendicular to the extension direction of the first functional film layer 301 and the second functional film layer 302 has a uniform thickness in the direction perpendicular to the extension direction of the second functional film layer 302, so the thickness of each of the first functional film layer 301 and the second functional film layer 302 may be a thickness in the direction perpendicular to its extension direction. In addition, the fracture toughness parameter of the first functional film layer 301 is approximately identical to that of the second functional film layer 302, so the sum of the thickness of the first functional film layer 301 and the thickness of the second functional film layer 302 may be taken as the first predetermined thickness, i.e., x in the formula (1).

A height of the step formed by the first functional pattern 201 at the second level-different region 402 in a direction perpendicular to the base substrate 10 may be just y in the formula (1).

The values of x, y and N may be substituted into the formula (1) so as to acquire the first target gradient angle a1 of the first functional pattern 201 at the first level-different region 401. For example, when the first functional pattern 201 is a first gate metal pattern, the first functional film layer 301 is a second gate insulation layer and the second functional film layer 302 is an interlayer insulation layer, the first target gradient angle a1 calculated through the formula (1) may be within the range of 40° to 45° (with the endpoint values inclusive).

According to the array substrate in the embodiments of the present disclosure, the first functional film layer 301 and the second function film layer 302 covering the first level-different region 301 may be formed on the first functional pattern 301 through a same process and using a same material, so that the second functional layer 30 with a larger thickness may be formed on the first functional pattern 201.

Hence, when calculating the first target gradient angle a1, the sum of the first functional film layer 301 and the second functional film layer 302 may be taken as the first predetermined thickness, and then the first target gradient angle a1 corresponding to the first functional pattern 201 may be determined in accordance with the first predetermined thickness. As a result, it is able to provide the first functional pattern 201 with a maximum gradient angle while preventing the second functional layer 30 from being broken at the level-different region, thereby to apply the array substrate to the thin and high-resolution display product in a better manner, improve the yield of the array substrate and reduce the material cost.

As shown in FIG. 2, in some embodiments of the present disclosure, the first functional layer 20 may further include a second functional pattern 202 arranged at a same layer and made of a same material as the first functional pattern 201, the second functional pattern 202 may form a second level-different region 402, and the first functional film layer 301 may cover the second level-different region 402. A portion of the second functional pattern 202 at the second level-different region 402 may be provided with a second target gradient angle a2, the second target gradient angle a2 may be a maximum gradient angle when the first functional film layer 301 has a second predetermined thickness, the second predetermined thickness may be a thickness of the first functional film layer 301 when a functional requirement of the first functional film layer 301 has been met and the first functional film layer 301 is not broken at the second level-different region, and the second target gradient angle a2 may be smaller than the first target gradient angle a1.

To be specific, the first functional layer 20 may further include the second functional pattern 202 arranged at a same layer and made of a same material as the first functional pattern 201, i.e., the second functional pattern 202 and the first functional pattern 201 may be formed simultaneously through a single patterning process. For example, the first functional pattern 201 and the second functional pattern 202 may each be a first gate metal pattern of a first gate metal layer, and the first functional pattern 201 may be arranged independent of the second functional pattern 202.

The first functional film layer 301 of the second functional layer 30 may cover the second level-different region 402 formed by the second functional pattern 202. In this regard, when calculating the second target gradient angle a2 of the second functional pattern 202 at the second level-different region 402, the thickness of the first functional film layer 301 when the functional requirement of the first functional film layer 301 has been met and the first functional film layer 301 is not broken at the second level-different region 402 may be taken as the second predetermined thickness, i.e., x in the formula (1).

A height of a step of the second functional pattern 202 at the second level-different region 402 in the direction perpendicular to the base substrate 10 may be just y in the formula (1).

The values of x, y and N may be substituted into the formula (1) so as to acquire the second target gradient angle a2 of the second functional pattern 202 at the second level-different region 402. For example, when the second functional pattern 202 is a first gate metal pattern and the first functional film layer 301 is a second gate insulation layer, the second target gradient angle a2 calculated through the formula (1) may be within the range of 26° to 29° (with the endpoint values inclusive).

In the array substrate according to the embodiments of the present disclosure, because the first functional film layer 301 covering the second level-different region 402 is thinner, i.e., the thickness of the first functional film layer 301 is smaller than the thickness of the second functional layer 30 covering the first level-different region 401 (i.e., the first functional film layer 301 and the second functional film layer 302), the calculated second target gradient angle a2 may be smaller than the first target gradient angle a1.

In the array substrate according to the embodiments of the present disclosure, the second functional pattern 202 may be provided with a maximum gradient angle while ensuring that the functional requirement of the first functional film layer 301 has been met and the first functional film layer 301 is not broken at the second level-different region 402, so it is able to apply the array substrate to the thin and high-resolution display product in a better manner, improve the yield of the array substrate and reduce the material cost.

As shown in FIG. 2, in some embodiments of the present disclosure, the first functional layer 20 may further include a third functional pattern 203 arranged at a side of the first functional film layer 301 away from the base substrate 10, the third functional pattern 203 may form a third level-different region 403 on the base substrate 10, and the second functional film layer 302 may cover the third level-different region 403. A portion of the third functional pattern 203 at the third level-different region 403 may be provided with a third target gradient angle a3, the third target gradient angle a3 may be a maximum gradient angle when the second functional film layer 302 has a third predetermined thickness, the third predetermined thickness may be a thickness of the second functional film layer 302 when a functional requirement of the second functional film layer 302 has been met and the second functional film layer 302 is not broken at the third level-different region 403, and the third target gradient angle a3 may be greater than the second target gradient angle a2 and smaller than the first target gradient angle a1.

To be specific, the first functional layer 20 may further include the third functional pattern 203. For example, the third functional pattern 203 may be a second gate metal pattern of a second gate metal layer.

The third functional pattern 203 may be arranged at a side of the first functional film layer 301 away from the base substrate 10, and form the third level-different region 403 on the base substrate 10. For example, an orthogonal projection of the third level-different region 403 onto the base substrate 10 may not overlap an orthogonal projection of the first functional pattern 201 onto the base substrate 10, and may not overlap an orthogonal projection of the second functional pattern 202 onto the base substrate 10.

In addition, an orthogonal projection of the third functional pattern 203 onto the base substrate 10 may overlap the orthogonal projection of the second functional pattern 202 onto the base substrate 10, so that the second functional pattern 202 and the third functional pattern 203 may form a capacitor structure.

The second functional film layer 302 of the second functional layer 30 may cover the third level-different region 403 formed by the third functional pattern 203. In this regard, when calculating the third target gradient angle a3 of the third functional pattern 203 at the third level-different region 403, the thickness of the second functional film layer 302 when the functional requirement of the second functional film layer 302 has been met and the second functional film layer 302 is not broken at the third level-different region 403 may be taken as the third predetermined thickness, i.e., x in the formula (1).

A height of a step of the third functional pattern 203 at the third level-different region 403 in the direction perpendicular to the base substrate 10 may be just y in the formula (1).

The values of x, y and N may be substituted into the formula (1) so as to acquire the third target gradient angle a3 of the third functional pattern 203 at the third level-different region 403. For example, when the third functional pattern 203 is a second gate metal pattern and the second functional film layer 302 is an interlayer insulation layer, the third target gradient angle a3 calculated through the formula (1) may be within the range of 35° to 39° (with the endpoint values inclusive).

In the array substrate according to the embodiments of the present disclosure, because the thickness of the first functional film layer 301 covering the third level-different region 403 is greater than the thickness of the first functional film layer 301 covering the second level-different region 402 and smaller than the second functional layer 30 covering the first level-different region 401 (i.e., the first functional film layer 301 and the second functional film layer 302), the calculated third target gradient angle a3 may be greater than the second target gradient angle a2 and smaller than the first target gradient angle a1.

In the array substrate according to the embodiments of the present disclosure, the third functional pattern may be provided with a maximum gradient angle while ensuring that the functional requirement of the second functional film layer has been met and the second functional film layer is not broken at the third level-different region, so it is able to apply the array substrate to the thin and high-resolution display product in a better manner, improve the yield of the array substrate and reduce the material cost.

As shown in FIG. 2, in some embodiments of the present disclosure, the first functional layer 20 may include a fourth functional pattern 204, and the fourth functional pattern 204 may form at least two fourth level-different regions 404 arranged sequentially on the base substrate 10 in a direction away from the base substrate 10. The second functional layer 30 may include a planarization layer arranged at a side of the fourth functional pattern 204 away from the base substrate 10 and covering the entire fourth functional pattern 204. A portion of the fourth functional pattern 204 at each fourth level-different region 404 may be provided with a fourth target gradient angle a4, the fourth target gradient angle a4 may be a maximum gradient angle when a first portion of the planarization layer at the fourth level-different region 404 corresponding to the fourth target gradient angle a4 has a fourth predetermined thickness, the fourth predetermined thickness may be a minimum thickness of the first portion in the direction perpendicular to the base substrate 10 when a functional requirement of the first portion has been met and the first portion is not broken at the fourth level-different region 404.

To be specific, the first functional layer 20 may further include the fourth functional pattern 204. For example, the fourth functional pattern 204 may be a first source-drain metal pattern of a first source-drain metal layer, or a second source-drain metal pattern of a second source-drain metal layer.

The fourth functional pattern 204 may form at least two fourth level-different regions 404 arranged sequentially on the base substrate 10 in the direction away from the base substrate 10. For example, in the at least two fourth level-different regions 404, the fourth level-different region 404 most closest to the base substrate 10 may be a level-different region formed by a peripheral portion of the fourth functional pattern 204, and the other fourth level-different regions 404 away from the base substrate 10 may be formed when the fourth functional pattern 204 covers a step at a bottom layer.

The second functional layer 30 may further include the planarization layer arranged at a side of the fourth functional pattern 204 away from the base substrate 10 and covering the entire fourth functional pattern 204, i.e., covering the fourth level-different region 404 formed by the fourth functional pattern 204. The planarization layer functions as to level up the step therebelow to provide the planarization layer with a flat surface away from the base substrate 10, so in the direction perpendicular to the base substrate 10, the planarization layer may be provided with different thicknesses at different regions. In this regard, when calculating the fourth target gradient angle a4 of each fourth level-different region 404, x in the formula (1) may have different values, so as to enable the portion of the fourth functional pattern 204 at each fourth level-different region 404 to have a corresponding fourth target gradient angle a4.

More specifically, as shown in FIG. 2, when a fourth level-different region 404 is formed by the peripheral portion of the fourth functional pattern 204, the fourth target gradient angle a4 corresponding to the fourth level-different region 404 may be a maximum gradient angle when the first portion of the planarization layer covering the fourth level-different region 404 has the fourth predetermined thickness, and the fourth predetermined thickness may be a minimum thickness of the first portion in the direction perpendicular to the base substrate 10 when the functional requirement of the first portion has been met and the first portion is not broken at the fourth level-different region 404, i.e., d1 in FIG. 2.

When calculating the target fourth gradient angle a4 corresponding to the fourth level-different region 404, the minimum thickness d1 of the first portion in the direction perpendicular to the base substrate 10 may be used as the fourth predetermined thickness, i.e., x in the formula (1). A height d4 of a step formed by the fourth functional pattern 204 at the fourth level-different region 404 in the direction perpendicular to the base substrate 10 may be just y in the formula (1). The values of x, y and N may be substituted into the formula (1) so as to acquire the fourth target gradient angle a4 of the fourth functional pattern 204 at the fourth level-different region 404.

In the array substrate according to the embodiments of the present disclosure, the fourth functional pattern 204 may be provided with a maximum gradient angle while ensuring that the functional requirement of the planarization layer has been met and the planarization layer is not broken at the fourth level-different region 404, so it is able to apply the array substrate to the thin and high-resolution display product in a better manner, improve the yield of the array substrate and reduce the material cost.

As shown in FIG. 2, in some embodiments of the present disclosure, the first functional layer 20 may include a first functional pattern 201, and the first functional pattern 201 may form a first level-different region on the base substrate. The second functional layer 30 may include a first functional film layer 301 arranged at a side of the first functional pattern 201 away from the base substrate 10 and a second functional film layer 302 arranged at a side of the first functional film layer 301 away from the base substrate 10, and the first functional film layer 301 and the second functional film layer 302 may both cover the first level-different region 401. The fourth functional pattern 204 may be arranged at a side of the second functional film layer 302 away from the base substrate 10 and cover the first level-different region 401.

To be specific, based on the structure in FIG. 2, the fourth functional pattern 204 may be arranged at a side of the second functional film layer 302 away from the base substrate 10 and cover the first level-different region 401. Hence, the fourth functional pattern 204 may form two fourth level-different regions 404. One fourth level-different region 404 may be arranged at a peripheral portion of the fourth functional pattern 204, and an orthogonal projection of the other fourth level-different region 404 onto the base substrate 10 may overlap an orthogonal projection of the first level-different region 401 onto the base substrate 10.

For example, when the fourth functional pattern 204 is a first source-drain metal pattern and the second functional layer 30 is a planarization layer, the fourth target gradient angle a4 corresponding to the peripheral portion of the fourth functional pattern 204 calculated through the formula (1) may be within the range of 60° to 75° (with the endpoint values inclusive).

It should be appreciated that, the planarization layer has a relatively large thickness, usually from 2 μm to 4 μm. In addition, a coating process is adopted, and the reaction of a reaction liquid (e.g., a developing liquid) at a large gradient angle may be affected by a metal gradient angle, leading to insufficient reaction. Hence, when N is substituted into the formula (1), its value may be smaller as compared with a situation where an inorganic layer is adopted.

It should be appreciated that, based on the structure in FIG. 2, the second functional film layer 302 and the planarization layer may both cover the third level-different region 403. However, usually the second functional film layer 302 is made of an inorganic material and the planarization layer is made of an organic material, so different manufacturing processes may be adopted and thereby N in the formula (1) may have different values. For example, the planarization layer may be formed through a coating process and the second functional film layer 302 may be formed through plasma-enhanced chemical vapor deposition, so when calculating the third target gradient angle a3 corresponding to the third level-different region 403, a sum of the thicknesses of the second functional film layer 302 and the planarization layer may not be substituted into the formula (1).

Figure 3:
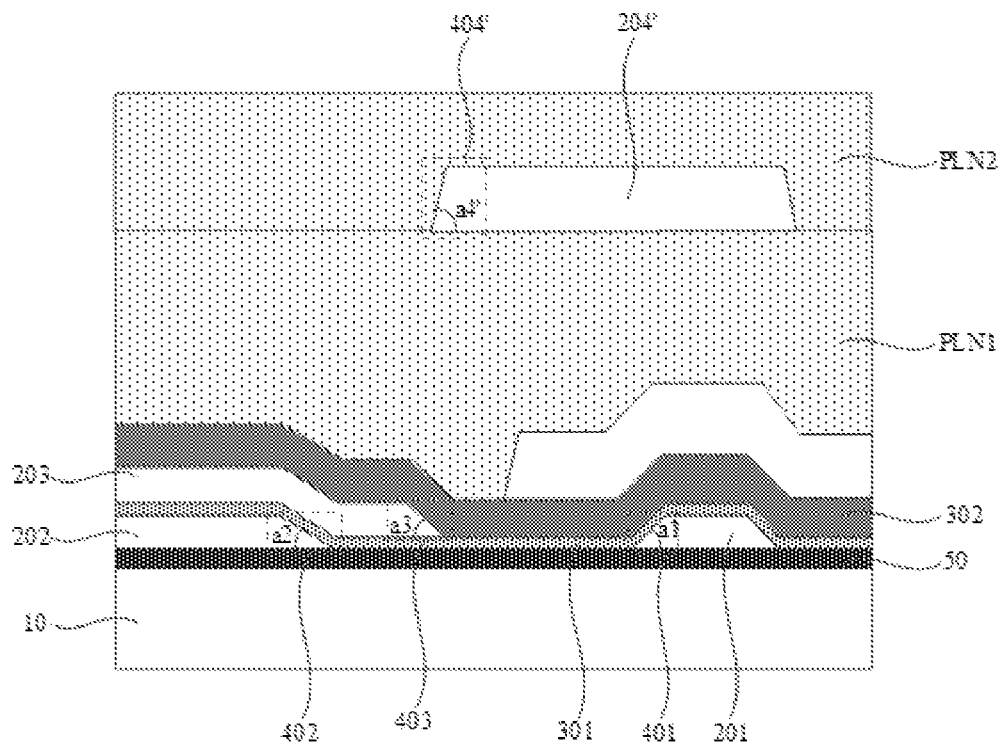
FIG. 3 is yet another sectional view of the array substrate according to one embodiment of the present disclosure.

As shown in FIG. 3, in some embodiments of the present disclosure, the planarization layer may include a first planarization layer PLN1 and a second planarization layer PLN2, the first functional layer may further include another fourth functional pattern 204' arranged at a side of the first planarization layer PLN1 away from the base substrate 10 and forming another fourth level-different region 404' on the base substrate 10, a portion of the other fourth functional pattern 204' at the other fourth level-different region 404' may be provided with another fourth target gradient angle a4', and the second planarization layer PLN2 may cover the other fourth functional pattern 204'.

To be specific, when the array substrate has the above-mentioned structure, the other fourth functional pattern 204' may be a second source-drain metal pattern. A film layer covered by the first planarization layer PLN1 may not be even enough at some positions, so a surface of the first planarization layer PLN1 away from the base substrate 10 may be fluctuated, and thereby the other fourth functional pattern 204' at a side of the first planarization layer PLN1 away from the base substrate 10 may form a plurality of other fourth level-different regions 404' (merely one is shown in FIG. 3).

For example, when the fourth functional pattern 204' is a second source-drain metal pattern and the second functional layer 30 is the second planarization layer PLN2, the fourth target gradient angle a4' corresponding to a peripheral portion of the fourth functional pattern 204' calculated through the formula (1) may be within the range of 60° to 85° (with the endpoint values inclusive).

Figure 4:
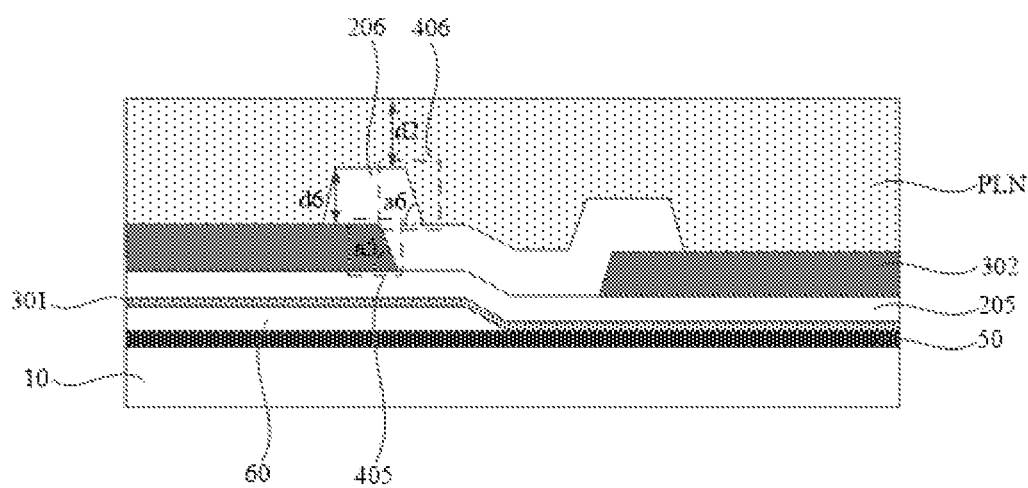
FIG. 4 is still yet another sectional view of the array substrate according to one embodiment of the present disclosure.

As shown in FIG. 4, in some embodiments of the present disclosure, the first functional layer 20 may include a fifth functional pattern 205 and a sixth functional pattern 206 laminated one on another in the direction away from the base substrate 10.

The second functional layer 30 may include a second functional film layer 302 arranged between the fifth functional pattern 205 and the sixth functional pattern 206, and a planarization layer PLN arranged at a side of the sixth functional pattern 206 away from the base substrate 10. The second functional film layer 302 may be provided with a first via-hole and form a fifth level-different region 405 at an edge of the first via-hole.

The sixth functional pattern 206 may be coupled to the fifth functional pattern 205 through the first via-hole, cover the fifth level-different region 405, and form a sixth level-different region 406 at a position corresponding to the fifth level-different region 406.

A portion of the second functional film layer 302 at the fifth level-different region 405 may be provided with a fifth target gradient angle a5. A portion of the sixth functional pattern 206 at the sixth level-different region 406 may be provided with a sixth target gradient angle a6. The sixth target gradient angle a6 may be a maximum gradient angle when a second portion of the planarization layer at the sixth level-different region 406 has a sixth predetermined thickness, and the sixth predetermined thickness may be a minimum thickness when a functional requirement of the second portion has been met and the second portion is not broken at the sixth level-different region 406. The gradient angle a5 of the second functional film layer 302 at the fifth level-different region 405 may be approximately equal to the sixth target gradient angle a6.

For example, the fifth functional pattern 205 may be a second gate metal pattern, a first gate metal pattern 60 may be arranged between the fifth gate metal pattern and the base substrate 10, and the sixth functional pattern 206 may be a first source-drain metal pattern.

The second functional film layer 302 may include the second functional film layer 302 arranged between the fifth functional pattern 205 and the sixth functional pattern 206, and the planarization layer arranged at a side of the sixth functional pattern 206 away from the base substrate 10. The second functional film layer 302 may be an interlayer insulation layer and provided with the first via-hole, and the second functional film layer 302 may form the fifth level-different region 405 at the edge of the first via-hole.

The sixth functional pattern 206 may be coupled to the fifth functional pattern 205 through the first via-hole, so the sixth functional pattern 206 may cover the edge of the first via-hole, thereby cover the fifth level-different region 405 formed at the edge of the first via-hole, and form the sixth level-different region 406 at a position corresponding to the fifth level-different region 405.

More specifically, as shown in FIG. 4, the sixth target gradient angle a6 corresponding to the sixth level-different region 406 may be a maximum gradient angle when the second portion of the planarization layer covering the sixth level-different region 406 has the sixth predetermined thickness, and the sixth predetermined thickness may be a minimum thickness when the functional requirement of the second portion has been met and the second portion is not broken at the sixth level-different region 406, i.e., d2 in FIG. 4.

When calculating the sixth target gradient angle a6 corresponding to the sixth level-different region 406, the minimum thickness d2 of the second portion in the direction perpendicular to the base substrate 10 may be taken as the sixth predetermined thickness, i.e., x in the formula (1). A height d6 of a step of the sixth functional pattern 206 at the sixth level-different region 406 in the direction perpendicular to the base substrate 10 may be just y in the formula (1). The values of x, y and N may be substituted into the formula (1) so as to acquire the sixth target gradient angle a6 of the sixth functional pattern 206 at the sixth level-different region 406.

It should be appreciated that, when the sixth functional pattern 206 is a first source-drain metal pattern, because metal is uneasily broken at the via-hole due to very high fracture toughness and the planarization layer has a relatively large thickness, the calculated sixth target gradient angle a6 may be relatively large and within the range of about 60° to 85° (with the endpoint values inclusive).

The sixth target gradient angle a6 is formed after covering the fifth level-different region 405 rather than through etching, i.e., the gradient angle of the sixth functional pattern 206 at the sixth level-different region 406 depends on the gradient angle of the fifth functional pattern 206 covered by the sixth functional pattern at the fifth level-different region 405, and the gradient angle of the sixth functional pattern 206 at the sixth level-different region 406 may be approximately equal to the gradient angle a5 of the fifth functional pattern 205 at the fifth level-different region 405. Hence, after calculating the value of the sixth target gradient angle a6, the gradient angle of the fifth functional pattern 205 at the fifth level-different region 405 may have the same value. In this regard, the subsequently-formed sixth functional pattern 206 may also have the value at the sixth level-different region 406.

According to the arrange substrate in the embodiments of the present disclosure, in the case of ensuring that the functional requirement of the planarization layer has been met and the planarization layer is not broken at the sixth level-different region 406, it is able to provide the sixth functional pattern 206 with a maximum gradient angle, thereby to apply the array substrate to a thin and high-resolution display product, improve the yield of the array substrate, and reduce the material cost.

Figure 5:
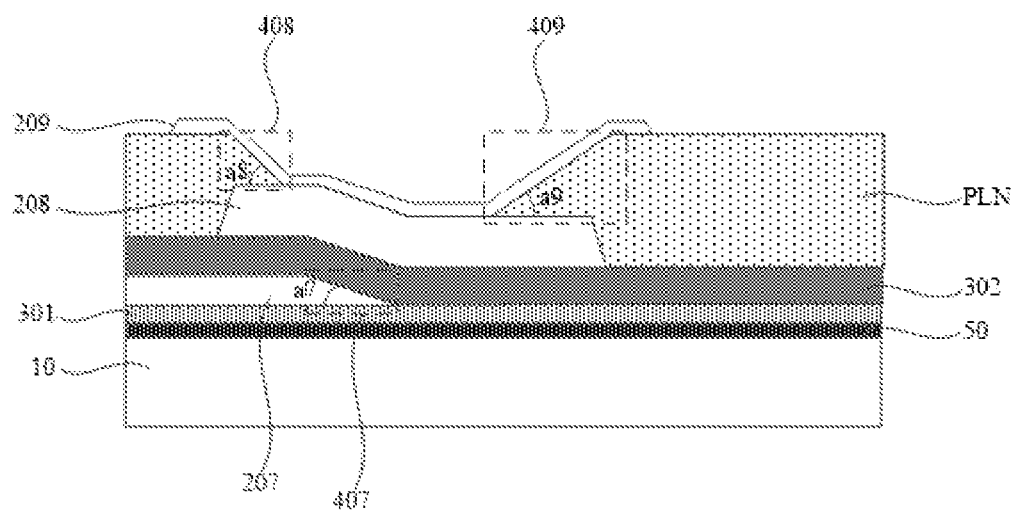
FIG. 5 is still yet another sectional view of the array substrate according to one embodiment of the present disclosure.
Figure 6:
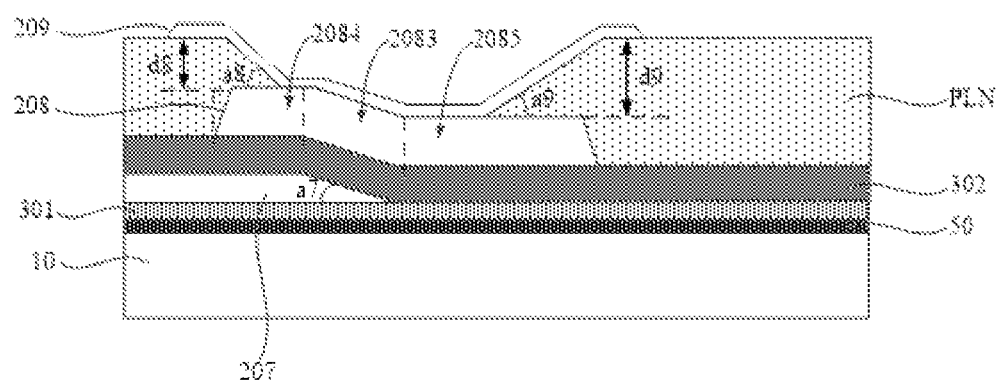
FIG. 6 is still yet another sectional view of the array substrate according to one embodiment of the present disclosure.

As shown in FIGS. 5 and 6, in some embodiments of the present disclosure, the first functional layer 20 may include: a seventh functional pattern 207 arranged on the base substrate 10 and forming a seventh level-different region 407 on the base substrate 10; an eighth functional pattern 208 arranged at a side of the seventh functional pattern 207 away from the base substrate 10, and including a third portion 2083 covering the seventh level-different region 407, a fourth portion 2084 covering the seventh functional pattern 207 other than the seventh level-different region 407, and a fifth portion 2085 not covering the seventh functional pattern 207; and a planarization layer PLN arranged at a side of the eighth functional pattern 208 away from the base substrate 10 and provided with a second via-hole. An orthogonal projection of the second via-hole onto the base substrate 10 may be located within an orthogonal projection of the eighth functional pattern 208 onto the base substrate 10, the planarization layer may form an eighth level-different region 408 and a ninth level-different region 409 at an edge of the second via-hole, an orthogonal projection of the eighth level-different region 408 onto the base substrate 10 may overlap an orthogonal projection of the fourth portion 2084 onto the base substrate 10, and an orthogonal projection of the ninth level-different region 409 onto the base substrate 10 may overlap an orthogonal projection of the fifth portion 2085 onto the base substrate 10.

The second functional layer 30 may include a second functional film layer 302 and a ninth functional pattern 209, the second functional film layer 302 may be arranged between the seventh functional pattern 207 and the eighth functional pattern 208, the ninth functional pattern 209 may be arranged at a side of the planarization layer away from the base substrate 10 and coupled to the eighth functional pattern 208 through the second via-hole, and the ninth functional pattern 209 may cover the eighth level-different region 408 and the ninth level-different region 409 and have a uniform thickness.

A portion of the planarization layer at the eighth level-different region 408 may be provided with an eighth target gradient angle a8, the eighth target gradient angle a8 may be a maximum gradient angle when the ninth functional pattern 209 has an eighth predetermined thickness, and the eighth predetermined thickness may be a thickness when a functional requirement of the ninth functional pattern 209 has been met and the ninth functional pattern 209 is not broken at the eighth level-different region 408.

A portion of the planarization layer at the ninth level-different region 409 may be provided with a ninth target gradient angle a9, the ninth target gradient angle a9 may be a maximum gradient angle when the ninth functional pattern 209 has a ninth predetermined thickness, and the ninth predetermined thickness may be a thickness when a functional requirement of the ninth functional pattern 209 has been met and the ninth functional pattern is not broken at the ninth level-different region 409.

To be specific, the seventh functional pattern 207 may be a second gate metal pattern, the eighth functional pattern 208 may be a first source-drain metal pattern, the ninth functional pattern 209 may be an anode pattern, and the second functional film layer 302 may be an interlayer insulation layer.

As shown in FIG. 6, the eighth functional pattern 208 may include the third portion 2083 covering the seventh level-different region 407, the fourth portion 2084 covering the seventh functional pattern 207 other than the seventh level-different region 407, and the fifth portion 2085 not covering the seventh functional pattern 207. In the direction perpendicular to the base substrate 10, a first height of a surface of the fourth portion 2084 away from the base substrate 10 may be greater than a second height of a surface of the fifth portion 2085 away from the base substrate 10. A surface of the third portion 2083 away from the base substrate 10 may include an oblique surface, and a third height of the oblique surface in the direction perpendicular to the base substrate 10 may be between the first height and the second height.

The planarization layer may be arranged at a side of the eighth functional pattern 208 away from the base substrate 10 and cover the entire eight functional pattern 208. Because different portions of the eighth functional pattern 208 have different heights, the planarization layer on the different portions may have different thicknesses, i.e., in the direction perpendicular to the base substrate 10, a thickness of the planarization layer on the fourth portion 2084 may be smaller than a thickness of the planarization layer on the fifth portion 2085.

The planarization layer may be provided with the second via-hole, and the orthogonal projection of the second via-hole onto the base substrate 10 may be located within the orthogonal projection of the eighth functional pattern 208 onto the base substrate 10. For example, the orthogonal projection of the second via-hole onto the base substrate 10 may overlap an orthogonal projection of the third portion 2083 onto the base substrate 10, an orthogonal projection of the fourth portion 2084 onto the base substrate 10, and an orthogonal projection of the fifth portion 2085 onto the base substrate 10.

The planarization layer may form the eighth level-different region 408 and the ninth level-different region 409 at the edge of the second via-hole. For example, the orthogonal projection of the eighth level-different region 408 onto the base substrate 10 may overlap the orthogonal projection of the fourth portion 2084 onto the base substrate 10, and the orthogonal projection of the ninth level-different region 409 onto the base substrate 10 may overlap the orthogonal projection of the fifth portion 2085 onto the base substrate 10.

The ninth functional pattern 209 may be arranged at a side of the planarization layer away from the base substrate 10 and coupled to the eighth functional pattern 208 through the second via-hole. The ninth functional pattern 209 may cover the eighth level-different region 408 and the ninth level-different region 409. An orthogonal projection a contact region between the eighth functional pattern 208 and the ninth functional pattern 209 onto the base substrate 10 may overlap the orthogonal projection of the third portion 2083 onto the base substrate 10, the orthogonal projection of the fourth portion 2084 onto the base substrate 10, and the orthogonal projection of the fifth portion 2085 onto the base substrate 10.

As shown in FIG. 5, a portion of the planarization layer at the eighth level-different region 408 may be provided with the eighth target gradient angle a8, the eighth target gradient angle a8 may be a maximum gradient angle when the ninth functional pattern 209 has the eighth predetermined thickness, and the eighth predetermined thickness may be a thickness when a functional requirement of the ninth functional pattern 209 has been met and the ninth functional pattern 209 is not broken at the eighth level-different region 408.

More specifically, as shown in FIG. 5, the eighth target gradient angle a8 corresponding to the eighth level-different region 408 may be a maximum gradient angle when the ninth functional pattern 209 has the eighth predetermined thickness, and the eighth predetermined thickness may be a thickness when the functional requirement of the ninth functional pattern 209 has been met and the ninth functional pattern 209 is not broken at the eighth level-different region 408. When calculating the eighth target gradient angle a8 corresponding to the eighth level-different region 408, the thickness of the ninth functional pattern 209 may be taken as x in the formula (1), and a height d8 of a step of the planarization layer at the eighth level-different region 408 in the direction perpendicular to the base substrate 10 may be taken as y in the formula (1). The values of x, y and N may be substituted into the formula (1) so as to acquire the eighth target gradient angle a8 of the planarization layer at the eighth level-different region 408. For example, the eighth target gradient angle a8 may be within the range of 40° to 50° (with the endpoint values inclusive).

As shown in FIG. 6, the ninth target gradient angle a9 corresponding to the ninth level-different region 409 may be a maximum gradient angle when the ninth functional pattern 209 has the ninth predetermined thickness, and the ninth predetermined thickness may be a thickness when a functional requirement of the ninth functional pattern 209 has been met and the ninth functional pattern 209 is not broken at the ninth level-different region 409. When calculating the ninth target gradient angle a9 corresponding to the ninth level-different region 409, the thickness of the ninth functional pattern 209 may be taken as x in the formula (1), and a height d9 of a step of the planarization layer at the ninth level-different region 409 in the direction perpendicular to the base substrate 10 may be taken as y in the formula (1). The values of x, y and N may be substituted into the formula (1) so as to acquire the ninth target gradient angle a9 of the planarization layer at the ninth level-different region 409. For example, the ninth target gradient angle a9 may be within the range of 35° to 45° (with the endpoint values inclusive).

Further, as shown in FIG. 6, the eighth target gradient angle a8 may be greater than the ninth target gradient angle a9. Because d8 is smaller than d9, the ninth functional pattern 209 may have a small breaking risk at the eighth level-different region 408. In addition, a numerical range of the eighth target gradient angle a8 may be positively correlated to d8, and a numerical range of the ninth target gradient angle a9 may be positively correlated to d9.

According to the array substrate in the embodiments of the present disclosure, in the case of ensuring that the functional requirement of the ninth functional pattern 209 has been met and the ninth functional pattern 209 is not broken at the eighth level-different region 408 and the ninth level-different region 409, it is able to provide the planarization layer with a maximum gradient angle at the edge of the second via-hole, thereby to apply the array substrate to a thin and high-resolution display product, improve the yield of the array substrate, and reduce the material cost.

Figure 7:
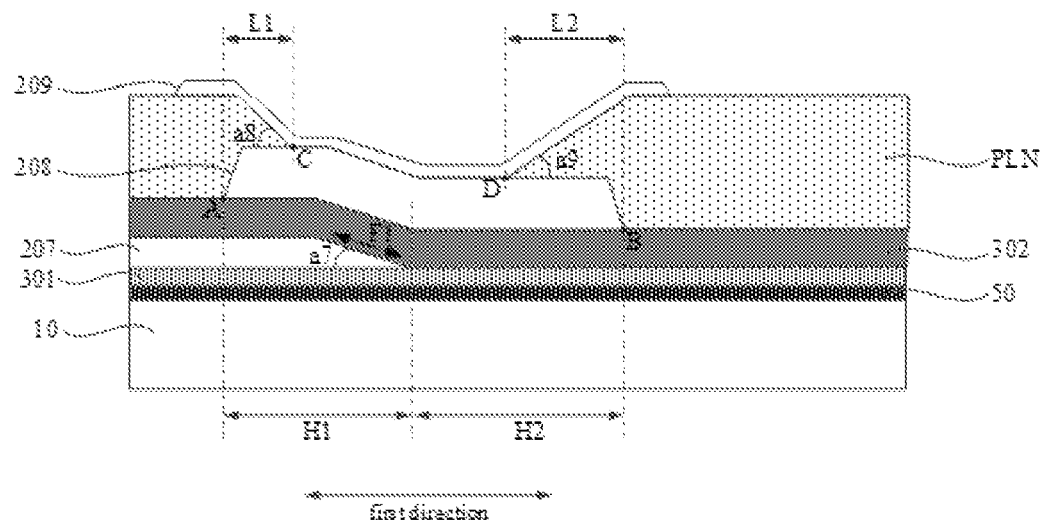
FIG. 7 is still yet another sectional view of the array substrate according to one embodiment of the present disclosure.

As shown in FIG. 7, in some embodiments of the present disclosure, an orthogonal projection of the seventh functional pattern 207 onto the base substrate 10 may overlap an orthogonal projection of the eighth functional pattern 208 onto the base substrate 10 at a first overlapping region, the first overlapping region has a first size H1 in a first direction, and a portion of the eighth functional pattern 208 not at the first overlapping region may have a second size H2 in the first direction.

The ninth functional pattern 209 and the eighth functional pattern 208 may form a first contact region, a minimum distance between a boundary of the first contact region (e.g., point C) and a first end (e.g., point A) of the eighth functional pattern 208 in the first direction may be a first interval L1, a minimum distance between the boundary of the first contact region (e.g., point D) and a second end (e.g., point B) of the eighth functional pattern 208 may be a second interval L2, the first end may be arranged opposite to the second end in the first direction, an orthogonal projection of the first end onto the base substrate 10 may overlap the seventh functional pattern 207, and an orthogonal projection of the second end onto the base substrate 10 may not overlap the seventh functional pattern 207.

A first absolute value corresponding to a difference between the first size H1 and the second size h2 may be in direct proportion to a second absolute value corresponding a difference between the first interval L1 and the second interval L2.

To be specific, the first direction may be a direction acquired after a shortest climbing direction F1 of the eighth functional pattern 208 on an oblique surface of the seventh functional pattern 207 at the seventh level-different region 407 has been projected onto the base substrate 10, as shown in FIG. 7.

The first absolute value corresponding to the difference between the first size H1 and the second size H2 may be in direct proportion to the second absolute value corresponding to the difference between the first interval L1 and the second interval L2, i.e., $|L1-L2|=M \cdot k|H1-H2|$, where M represents the quantity of functional patterns right below the eighth functional pattern 208 (e.g., metal patterns), k is within the range of 0.01 to 10 (with the endpoint values inclusive), k represents an overlapping position relationship between the seventh functional pattern 207 and the eighth functional pattern 208 in the direction perpendicular to the base substrate, and k is associated with the seventh target gradient angle a7 and the eighth target gradient angle a8 as well as the distribution of the seventh functional pattern 207 and the eighth functional pattern 208.

A maximum value of the absolute value of H1−H2 may be a first width of the eighth functional pattern 208 in the first direction, and a maximum value of the absolute value of L1−L2 may be a value acquired through subtracting a second width of the first contact region in the first direction from the first width. When the second width is 9/10 of the first width and L2 is 0, L1−L2 may be just 1/10 of the first width. It should be appreciated that, a minimum value of L1−L2 may be 0, and a minimum value of H1−H2 may be 0.

For example, M=1, L1−L2=0.01 μm, H1−H2=0.1 μm, and k=0.1.

For another example, M=1, L1−L2=0.019 μm, H1−H2=0.2 μm, and k=0.1.

For yet another example, M=1, L1−L2=0.032 μm, H1−H2=0.3 μm, and k=0.11.

For still yet another example, M=1, L1−L2=0.042 μm, H1−H2=0.4 μm, and k=0.1.

For still yet another example, M=1, L1−L2=0.05 μm, H1−H2=0.5 μm, and k=0.1.

According to the array substrate in the embodiments of the present disclosure, through appropriately adjusting H1, H2, L1 and L2, it is able to minimize the seventh target gradient angle a7, the eighth target gradient angle a8 and the ninth target gradient angle a9 while ensuring excellent contact performance between the ninth functional pattern 209 and the eighth functional pattern 208, thereby to apply the array substrate to the thin, high-resolution display product in a better manner.

As shown in FIG. 7 in some embodiments of the present disclosure, the second absolute value corresponding to the difference between the first interval L1 and the second interval L2 may be in direct proportion to a ratio of the first interval L1 to a first width of the eighth functional pattern 208 (i.e., H1+H2) in the first direction.

In some embodiments of the present disclosure, when the first size H1 is greater than the first interval L1, the eighth target gradient angle a8 may be greater than the ninth target gradient angle a9, or a difference between the eighth target gradient angle a8 and the ninth target gradient angle a9 may be in direct proportion to the first size H1.

In some embodiments of the present disclosure, the difference between the eighth target gradient angle a8 and the ninth target gradient angle a9 may be smaller than a seventh target gradient angle a7 of the seventh functional pattern 208 at the seventh level-different region 407, the seventh target gradient angle a7 may be a maximum gradient angle when the second functional film layer 302 has a seventh predetermined thickness, and the seventh predetermined thickness may be a thickness when a functional requirement of the second functional film layer 302 has been met and the second functional film layer 302 is not broken at the seventh level-different region 407.

According to the array substrate in the embodiments of the present disclosure, through appropriately adjusting H1, H2, L1 and L2, it is able to minimize the seventh target gradient angle a7, the eighth target gradient angle a8 and the ninth target gradient angle a9 while ensuring excellent contact performance between the ninth functional pattern 209 and the eighth functional pattern 208, thereby to apply the array substrate to the thin, high-resolution display product in a better manner.

When calculating the seventh target gradient angle a7, a thickness of the second functional film layer 302 may be x in the formula (1), a thickness of the seventh functional pattern 207 in the direction perpendicular to the base substrate 10 may be y in the formula (1), and an appropriate value of N may be selected, so as to acquire a value of the seventh target gradient angle a7.

Figure 8:
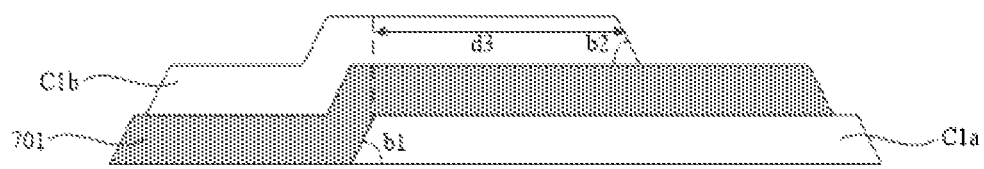
FIG. 8 is a sectional view of a first capacitor structure according to one embodiment of the present disclosure.

As shown in FIG. 8, in some embodiments of the present disclosure, the array substrate may include a capacitor structure. The first functional layer 20 may include a first electrode plate of the capacitor structure, and the first electrode plate may form an electrode plate level-different region on the base substrate 10. The second functional layer 30 may include a dielectric layer arranged at a side of the first electrode plate away from the base substrate 10 and covering the entire first electrode plate. A portion of the first electrode plate at the electrode plate level-different region may be provided with an electrode plate target gradient angle, the electrode plate target gradient angle may be a maximum gradient angle when the dielectric layer has a tenth predetermined thickness, and the tenth predetermined thickness may be a thickness when a functional requirement of the dielectric layer has been met and the dielectric layer is not broken at the electrode plate level-different region. A second electrode plate of the capacitor structure may be arranged at a side of the dielectric layer away from the base substrate 10, an orthogonal projection of the second electrode plate onto the base substrate 10 may overlap an orthogonal projection of the first electrode plate onto the base substrate 10 at a first overlapping region, and the second electrode plate may covers the electrode plate level-different region.

To be specific, the array substrate may include a plurality of capacitor structures, and these capacitor structures may be applied to, but not limited to, a pixel driving circuit and a gate driving circuit of the array substrate.

It should be appreciated that, electricity quantity Q of one capacitor structure is 1C, a potential difference between two electrode plates of the capacitor structure may be 1V, and a capacitance C of the capacitor structure may be 1F, i.e., C=Q/U. However, a size of the capacitance of the capacitor structure is not determined by Q or U, a decision equation of the size of the capacitance is $C=\varepsilon S/(4\pi kd)$, where $\varepsilon$ represents a dielectric constant of a medium between the electrode plates, S represents an overlapping area between the first electrode plate and the second electrode plate of the capacitor structure, d represents a distance between the first electrode plate and the second electrode plate of the capacitor structure, and k represents an electrostatic force constant. For a common plane-parallel capacitor, its capacitance may be $C=\varepsilon S/d$.

The first electrode plate of the capacitor structure may be a first gate metal pattern, the second electrode plate of the capacitor structure may be a second gate metal pattern, and the dielectric layer may be a second gate insulation layer. However, the present disclosure shall not be limited thereto.

The first functional layer 20 may include the first electrode plate of the capacitor structure, and the second functional layer 30 may include the dielectric layer at a side of the first electrode plate away from the base substrate 10. When calculating the electrode plate target gradient angle of the portion of the first electrode plate at the electrode plate level-different region, a thickness of the dielectric layer may be x in the formula (1), a height of a step formed by the first electrode plate may be y in the formula (1), $K_{IC}$ represents a fracture toughness parameter of the dielectric layer, and W represents an empirical value related to a formation process of the dielectric layer and a specific interlayer structure. For example, W may be within the range of 0.4 to 2.2 (with the endpoint values inclusive), and z may be within the range of 1 to 1.1 in unit of $Mpa\hat{\ }-1\cdot m\hat{\ }-\frac{1}{2}$.

It should be appreciated that, the dielectric layer may have a uniform or non-uniform thickness according to the practical need. When the dielectric layer has a uniform thickness, the thickness of the dielectric layer may be directly taken as x, and when the dielectric layer has a non-uniform thickness, a minimum thickness of a portion of the dielectric layer at the electrode plate level-different region in the direction perpendicular to the base substrate 10 may be taken as x. In addition, when the functional requirement of the dielectric layer has been met, it means that the first electrode plate is insulated from the second electrode plate through the dielectric layer, and/or the capacitor structure has a required capacitance through the dielectric layer. Further, the capacitance of the capacitor structure may be related to the overlapping area between the first electrode plate and the second electrode plate, i.e., an area of the first overlapping region where the orthogonal projection of the first electrode plate onto the base substrate overlaps the orthogonal projection of the second electrode plate onto the base substrate.

The portion of the first electrode plate at the electrode plate level-different region may be provided with the electrode plate target gradient angle, so as to provide the first electrode plate with a maximum gradient angle in the case of ensuring that the functional requirement of the dielectric layer has been met and the dielectric layer is not broken at the electrode plate level-different region.

Moreover, in the case that the gradient angle of the first electrode plate is relatively large, when the second electrode plate covers the electrode plate level-different region, it is necessary to provide a larger overlapping area between the second electrode plate and the first electrode plate, so as to ensure that the second electrode plate is lapped onto the first electrode plate at the electrode plate level-different region in a better manner and prevent the second electrode plate from falling off from the first electrode plate. Hence, when the array substrate is provided with the above structure, it is able to increase the overlapping area between the first electrode plate and the second electrode plate, thereby to increase the capacitance of the capacitor structure.

It should be appreciated that, various ways may be provided so as to provide a larger overlapping area between the second electrode plate and the first electrode plate. For example, as shown in FIG. 8, a length d3 of the second electrode plate may be increased, or a size of the second electrode plate in a direction perpendicular to a length direction may be increased.

Figure 9:
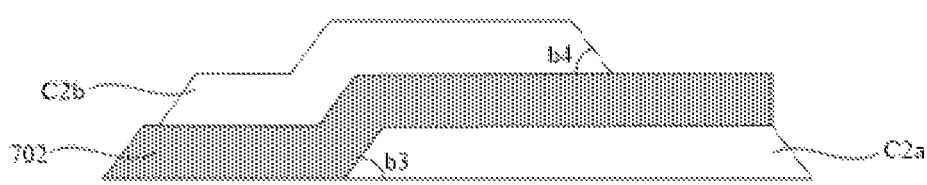
FIG. 9 is a sectional view of a second capacitor structure according to one embodiment of the present disclosure.
Figure 10:
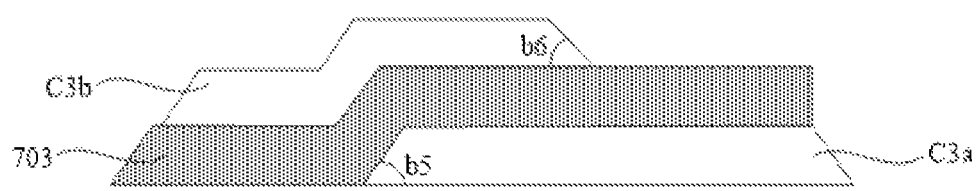
FIG. 10 is a sectional view of a third capacitor structure according to one embodiment of the present disclosure.

As shown in FIGS. 8 to 10, in some embodiments of the present disclosure, the capacitor structure may include a first capacitor structure, a second capacitor structure and a third capacitor structure, and a capacitance of the first capacitor structure may be greater than a capacitance of the second capacitor structure and/or greater than a capacitance of the third capacitor structure. An electrode plate target gradient angle b1 corresponding to a first electrode plate C1a of the first capacitor structure may be greater than an electrode plate target gradient angle b3 corresponding to a first electrode plate C2a of the second capacitor structure, and/or greater than an electrode plate target gradient angle b5 corresponding to a first electrode plate C3a of the third capacitor structure.

To be specific, the quantity of the capacitor structures in the array substrate may be set according to the practical need. For example, the capacitor structure may include the first capacitor structure, the second capacitor structure and the third capacitor structure. When the array substrate is applied to an Organic Light-Emitting Diode (OLED) display device and each pixel unit in the display device includes a red subpixel, a green subpixel and a blue subpixel adjacent to each other, the red subpixel may include the first capacitor structure, the green subpixel may include the second capacitor structure, and the blue subpixel may include the third capacitor structure.

Figure 11:
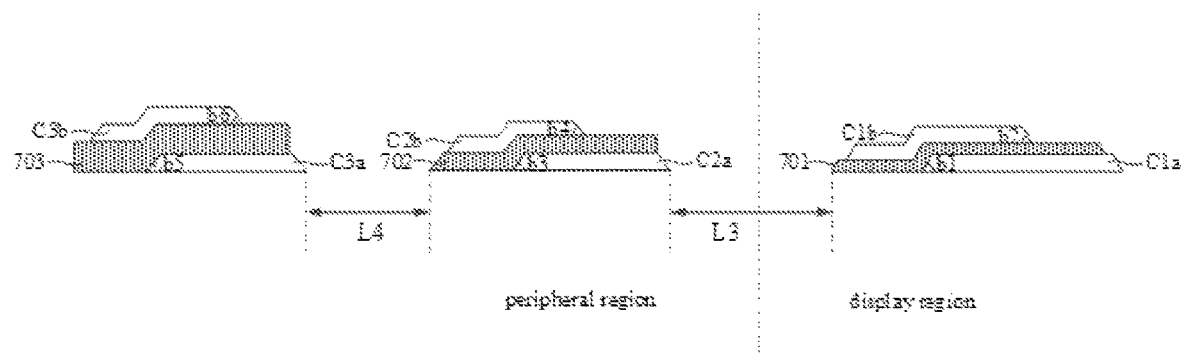
FIG. 11 is a schematic view showing a capacitor structure at a display region and a peripheral region according to one embodiment of the present disclosure.

In addition, as shown in FIG. 11, the first capacitor structure may be arranged at a display region of the display device, and the second capacitor structure and the third capacitor structure may be arranged at a peripheral region of the display device. In this arrangement mode, a distance L3 between the first capacitor structure and the second capacitor structure may be greater than a distance L4 between the second capacitor structure and the third capacitor structure.

It should be appreciated that, the first electrode plate C1a of the first capacitor structure, the first electrode plate C2a of the second capacitor structure and the first electrode C3a of the third capacitor structure may be arranged at a same layer and made of a same material, or arranged at different layers and made of a same material. Identically, a second electrode plate C1b of the first capacitor structure, a second electrode plate C2b of the second capacitor structure and a second electrode C3b of the third capacitor structure may be arranged at a same layer and made of a same material, or arranged at different layers and made of a same material. For example, the first electrode plate C1a of the first capacitor structure, the first electrode plate C2a of the second capacitor structure and the first electrode C3a of the third capacitor structure may each be made of a first gate metal layer in the array substrate, the second electrode plate C1b of the first capacitor structure may be made of a second gate metal layer in the array substrate, and the second electrode plate C2b of the second capacitor structure and the second electrode plate C3b of the third capacitor structure may each be made of a source-drain metal layer in the array substrate.

To be specific, the following mode may be provided so as to enable the capacitance of the first capacitor structure to be greater than the capacitance of the second capacitor structure and/or the capacitance of the third capacitor structure. The electrode plate target gradient angle b1 corresponding to the first electrode plate C1a of the first capacitor structure may be set as being greater than the electrode plate target gradient angle b3 corresponding to the first electrode plate C2a of the second capacitor structure and/or the electrode plate target gradient angle b5 corresponding to the first electrode plate C3a of the third capacitor structure.

More specifically, when the electrode plate target gradient angle b1 corresponding to the first electrode plate C1a of the first capacitor structure is greater than the electrode plate target gradient angle b3 corresponding to the first electrode plate C2a of the second capacitor structure, an area of the overlapping region where the orthogonal projection of the first electrode plate C1a of the first capacitor structure onto the base substrate overlaps the orthogonal projection of the second electrode plate C1b onto the base substrate may be greater than an area of the overlapping region where the orthogonal projection of the first electrode plate C2a of the second capacitor structure onto the base substrate overlaps the orthogonal projection of the second electrode plate C2b onto the base substrate, so as to enable the capacitance of the first capacitor structure to be greater than the capacitance of the second capacitor structure.

In some embodiments of the present disclosure, in the direction perpendicular to the base substrate 10, a thickness of a first dielectric layer 701 corresponding to the first capacitor structure may be smaller than a thickness of a second dielectric layer 702 corresponding to the second capacitor structure, and/or smaller than a thickness of a third dielectric layer 703 corresponding to the third capacitor structure.

To be specific, the smaller the thickness of the dielectric layer between the first electrode plate and the second electrode plate is, the larger the capacitance of the capacitor structure is. Hence, when the thickness of the first dielectric layer 701 corresponding to the first capacitor structure is smaller than the thickness of the second dielectric layer 702 corresponding to the second capacitor structure in the direction perpendicular to the base substrate 10, it is able to enable the capacitance of the first capacitor structure to be greater than that of the second capacitor structure. When the thickness of the first dielectric layer 701 corresponding to the first capacitor structure is smaller than the thickness of the third dielectric layer 703 corresponding to the third capacitor structure in the direction perpendicular to the base substrate 10, the capacitance of the first capacitor structure may be greater than that of the third capacitor structure.

For example, as shown in FIG. 11, the thickness of the first dielectric layer 701 may be smaller than the thickness of the second dielectric layer 702, and the thickness of the second dielectric layer 702 may be smaller than the thickness of the third dielectric layer 703. Further, a difference between the thickness of the second dielectric layer 702 and the thickness of the first dielectric layer 701 may be within the range of 1500 Å to 5000 Å (with the endpoint values inclusive).

In some embodiments of the present disclosure, a gradient angle b2 of a portion of the second electrode plate C1b of the first capacitor structure at the corresponding first overlapping region may be greater than a gradient angle b4 of a portion of the second electrode plate C2b of the second capacitor structure at the first overlapping region, and/or greater than a gradient angle b6 of a portion of the second electrode plate C3b of the third capacitor structure at the corresponding first overlapping region.

To be specific, the larger the gradient angle of the portion of the second electrode plate at the first overlapping region is, the larger the overlapping area between the second electrode plate and the corresponding first electrode plate is, and the larger the capacitance of the formed capacitor structure is. Hence, when the gradient angle b2 of the portion of the second electrode plate C1b of the first capacitor structure at the corresponding first overlapping region is greater than the gradient angle b4 of the portion of the second electrode plate C2b of the second capacitor structure at the first overlapping region, the capacitance of the first capacitor structure may be greater than that of the second capacitor structure. When the gradient angle b2 of the portion of the second electrode plate C1b of the first capacitor structure at the corresponding first overlapping region is greater than the gradient angle b6 of the portion of the second electrode plate C3b of the third capacitor structure at the corresponding first overlapping region, the capacitance of the first capacitor structure may be greater than that of the third capacitor structure.

Hence, when setting the capacitance of the capacitor structure, it is able to adjust the capacitance of the capacitor structure through adjusting the electrode plate target gradient angle of the first electrode plate, the gradient angle of the portion of the second electrode plate at the corresponding first overlapping region, and the thickness of the dielectric layer between the first electrode plate and the second electrode plate.

For example, the electrode plate target gradient angle b1 corresponding to the first electrode plate C1a of the first capacitor structure may be within the range of 30° to 55°, the gradient angle b2 of the portion of the second electrode plate C1b of the first capacitor structure at the corresponding first overlapping region may be within the range of 35° to 85°, and a difference between the electrode plate target gradient angle b1 and the gradient angle b2 may be 12° to 30°. The electrode plate target gradient angle b3 corresponding to the first electrode plate C2a of the second capacitor structure may be within the range of 28° to 52°, and the electrode plate target gradient angle b5 corresponding to the first electrode plate C3a of the third capacitor structure may be within the range of 25° to 50°.

For another example, the electrode plate target gradient angle b1 corresponding to the first electrode plate C1a of the first capacitor structure may be within the range of 30° to 55°, the gradient angle b2 of the portion of the second electrode plate C1b of the first capacitor structure at the corresponding first overlapping region may be within the range of 45° to 85°, and a difference between the electrode plate target gradient angle b1 and the gradient angle b2 may be 15° to 30°. The electrode plate target gradient angle b3 corresponding to the first electrode plate C2a of the second capacitor structure may be within the range of 20° to 45°, the gradient angle b4 of the portion of the second electrode plate C2b of the second capacitor structure at the corresponding first overlapping region may be within the range of 25° to 50°, and a difference between the electrode plate target gradient angle b3 and the gradient angle b4 may be 10° to 25°. The electrode plate target gradient angle b5 corresponding to the first electrode plate C3a of the third capacitor structure may be within the range of 15° to 30°, the gradient angle b6 of the portion of the second electrode plate C3b of the third capacitor structure at the corresponding first overlapping region may be within the range of 20° to 40°, and a difference between the electrode plate target gradient angle b5 and the gradient angle b6 may be 5° to 20°.

Further, the capacitance of the first capacitor structure may be 1.05 to 2.5 times of the capacitance of the second capacitor structure, and 1.10 to 3 times of the capacitance of the third capacitor structure.

It should be appreciated that, in the capacitor structure, the larger the electrode plate target gradient angle corresponding to the first electrode plate is, the larger the area of a portion of the second electrode plate covered by an upper layer or the larger the thickness of the dielectric layer is.

Figure 12:
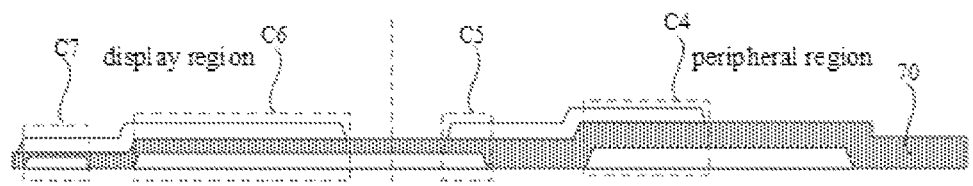
FIG. 12 is another schematic view showing the capacitor structure at the display region and the peripheral region according to one embodiment of the present disclosure.

As shown in FIG. 12, in some embodiments of the present disclosure, at a peripheral region, an electrode plate target gradient angle of a first electrode plate of a fourth capacitor structure C4 may be greater than an electrode plate target gradient angle of a first electrode plate of a fifth capacitor structure C5, so a right end portion of a second electrode plate of the fourth capacitor structure C4 needs to extend to the right as possible, so as to prevent the second electrode plate from falling off at the electrode plate target gradient angle of the first electrode plate of the fourth capacitor structure C4. Identically, at a display region, an electrode plate target gradient angle of a first electrode plate of a sixth capacitor structure C6 may be greater than an electrode plate target gradient angle of a first electrode plate of a seventh capacitor structure C7, so a right end portion of a second electrode plate of the sixth capacitor structure C6 needs to extend to the right as possible, so as to prevent the second electrode plate from falling off at the electrode plate target gradient angle of the first electrode plate of the sixth capacitor structure C6.

It should be appreciated that, when the right end portion of the second electrode plate of the fourth capacitor structure C4 extends to the right as possible, it is able to increase an overlapping area between the second electrode plate and the first electrode plate of the fourth capacitor structure C4. Identically, when the right end portion of the second electrode plate of the sixth capacitor structure C6 extends to the right as possible, it is able to increase an overlapping area between the second electrode plate and the first electrode plate of the sixth capacitor structure C6.

It should be appreciated that, the first electrode plate of each capacitor structure may be arranged between the base substrate and the second electrode plate, and an overlapping rate that the second electrode plate of each capacitor structure covers the first electrode plate may be set according to the practical need. For example, an overlapping rate corresponding to the seventh capacitor structure C7 may be 100%, and an overlapping rate corresponding to the sixth capacitor structure C6 may be 40% to 60%.

It should be appreciated that, the overlapping rate refers to a ratio of an area of the first electrode plate covered by the second electrode plate to an area of the entire first electrode plate. As shown in FIG. 12, the first electrode plate of the seventh capacitor structure C7 is completely covered by the second electrode plate, and a part of the first electrode plate of the sixth capacitor structure C6 is covered by the second electrode plate.

In addition, a thickness of a dielectric layer 70 in each of the fourth capacitor structure C4 and the fifth capacitor structure C5 may be different from a thickness of the dielectric layer 70 in each of the sixth capacitor structure C6 and the seventh capacitor structure C7. For example, the dielectric layer 70 in the fourth capacitor structure C4 and the fifth capacitor structure C5 may include a second gate insulation layer and an interlayer insulation layer, and the dielectric layer 70 in the sixth capacitor structure C6 and the seventh capacitor structure C7 may include a second gate insulation layer.

It should be appreciated that, in the above-mentioned array substrate, a thickness of each of the first gate metal pattern and the second gate metal pattern may be greater than, or smaller than, a thickness of each of the first source-drain metal pattern and the second source-drain metal pattern.

The gradient angle corresponding to each of the first gate metal pattern and the second gate metal pattern may be greater than, or smaller than the gradient angle corresponding to each of the first source-drain metal pattern and the second source-drain metal pattern.

Figure 13:
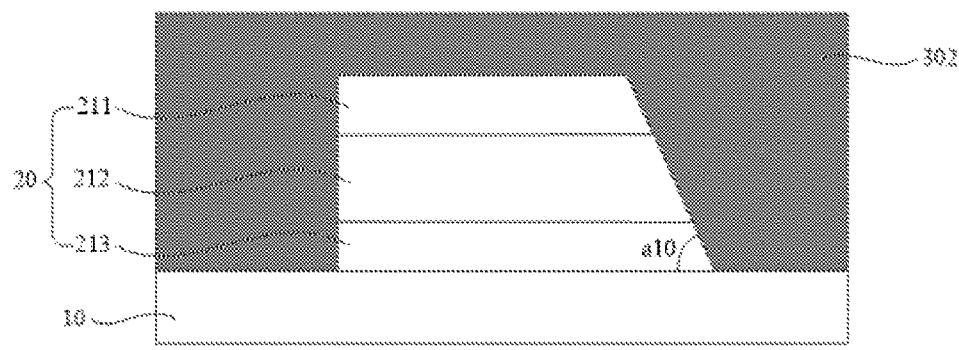
FIG. 13 is a sectional view of a first functional layer according to one embodiment of the present disclosure.
Figure 14:
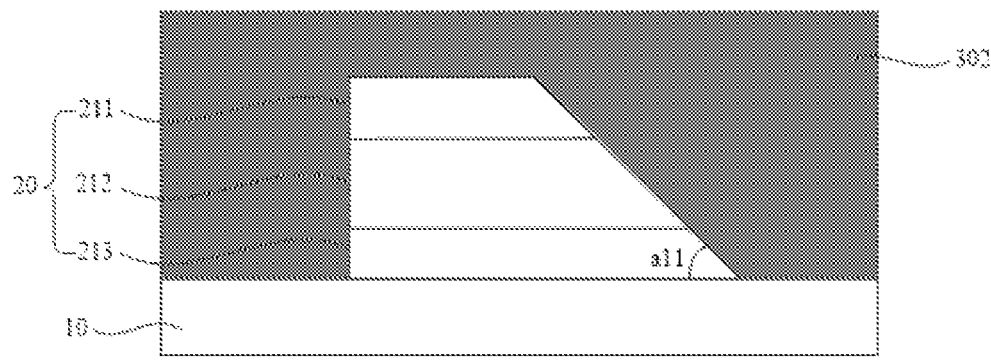
FIG. 14 is another sectional view of the first functional layer according to one embodiment of the present disclosure.

As shown in FIGS. 13 and 14, in some embodiments of the present disclosure, the first functional layer 20 may include a composite metal pattern, the composite metal pattern may include a first metal sub-pattern 213, a second metal sub-pattern 212 and a third metal sub-pattern 211 laminated one on another in the direction away from the base substrate 10, and the first metal sub-pattern 213 may be made of a same material as the third metal sub-pattern 211. The target gradient angle of the first functional layer 20 may be in reverse proportion to an etching rate of the third metal sub-pattern 211 when forming the first functional layer 20 through etching.

To be specific, when a metal layer is made of different materials, the gradient angle of the metal layer may be different when a same etching process is adopted. As shown in FIG. 13, the first metal sub-pattern 213 and the third metal sub-pattern 211 may be made of Ti, and the second metal sub-pattern 212 may be made of Al, i.e., the composite metal pattern may be a Ti/Al/Ti composite metal film layer. When the Ti/Al/Ti composite metal pattern is etched through a wet-etching process, Ti may be etched at a small etching rate and more etchant may be consumed, so a concentration of the etchant for Al may be relatively low and thereby an etching rate of Al may become small too. At this time, the Ti/Al/Ti composite metal pattern may have a relatively large gradient angle (e.g., a10), usually greater than 50°. In order to meet the formula (1), the second functional layer 30 deposited on the Ti/Al/Ti composite metal pattern (e.g., the second functional film layer 302) needs to be provided with a larger thickness, so N in $\text{Tan}(a)-1 \leq N(x-y)/y \leq \text{Tan}(a)+1$ needs to be provided with a larger value, usually an upper limit, i.e., 0.9, may be selected.

In addition, in the case that the thickness of the second functional layer 30 is merely capable of being adjusted within a limited range, such process parameters as the concentration of the etchant may be adjusted, so as to enable the gradient angle of the composite metal pattern to meet the requirement. It should be appreciated that, apart from the Ti/Al/Ti composite metal pattern, the composite metal pattern may also be, but not limited to, a Mo/Al/Mo composite metal pattern.

As shown in FIG. 14, the first metal sub-pattern 213 and the third metal sub-pattern 211 may be made of Mn, and the second metal sub-pattern 212 may be made of Cu, i.e., the composite metal pattern may be a Mn/Cu/Mn composite metal film layer. When the Mn/Cu/Mn composite metal pattern is etched through a wet-etching process, Mn may be etched at a large etching rate and fewer etchant may be consumed, so a concentration of the etchant for Cu may be relatively high and thereby an etching rate of Cu may become larger. At this time, the Mn/Cu/Mn composite metal pattern may have a relatively small gradient angle (e.g., a11), usually smaller than 50°. In order to meet the formula (1), the second functional layer 30 deposited on the Mn/Cu/Mn composite metal pattern (e.g., the second functional film layer 302) needs to be provided with a smaller thickness, so N in $\text{Tan}(a)-1 \leq N(x-y)/y \leq \text{Tan}(a)+1$ needs to be provided with a smaller value, usually a lower limit, i.e., 0.8, may be selected. In addition, in the case that the thickness of the second functional layer 30 is merely capable of being adjusted within a limited range, such process parameters as the concentration of the etchant may be adjusted, so as to enable the gradient angle of the composite metal pattern to meet the requirement. It should be appreciated that, apart from the Mn/Cu/Mn composite metal pattern, the composite metal pattern may also be, but not limited to, a Mo/Cu/Mo composite metal pattern.

Hence, after the corresponding target gradient angle has been determined through the formula (1), the desired target gradient angle may be formed through selecting the material and controlling the etching process.

The present disclosure further provides in some embodiments a display device including the above-mentioned array substrate.

According to the array substrate in the embodiments of the present disclosure, the portion of the first functional layer 20 at the level-different region may be provided with the target gradient angle, the target gradient angle may be a maximum gradient angle when the second functional layer has the predetermined thickness, and the predetermined thickness may be a thickness when the functional requirement of the second functional layer itself has been met and the second functional layer is not broken at the level-different region. In this regard, it is able to, while providing the first functional layer 20 with a maximum gradient angle, provide the second functional layer 30 with a minimum thickness when the functional requirement of the second functional layer 30 has been met and the second functional layer 30 is not broken at the level-different region. As a result, in the case of ensuring that the functional layer is not broken, it is able to provide the thinnest second functional layer 30 with a maximum gradient angle, thereby to apply the array substrate to a thin and high-resolution display product, improve the yield of the array substrate, and reduce the material cost.

Hence, when the display device includes the above-mentioned array substrate, a same beneficial effect may be achieved, which will not be particularly defined herein.

It should be appreciated that, the display device may be any product or member having a display function, e.g., television, display, digital photo frame, mobile phone or tablet computer.

The present disclosure further provides in some embodiments a method for manufacturing the above-mentioned array substrate, which includes: forming the first functional layer on the base substrate 10, the first functional layer 20 forming a level-different region on the base substrate 10, and a portion of the first functional layer 20 at the level-different region being provided with a target gradient angle; and forming the second functional layer 30 at a side of the first functional layer 20 away from the base substrate 10, the second functional layer 30 covering the level-different region. The target gradient angle is a maximum gradient angle when the second functional layer 30 has a predetermined thickness, and the predetermined thickness is a thickness when a functional requirement of the second functional layer 30 has been met and the second functional layer 30 is not broken at the level-different region. The target gradient angle of the first functional layer and the predetermined thickness of the second functional layer meet $\text{Tan}(a)-1 \leq N(x-y)/y \leq \text{Tan}(a)+1$, where $N=z \times W \times K_{IC}$, z is a constant, W is a predetermined value, $K_m$ is a fracture toughness parameter, x is the predetermined thickness of the second functional layer, y is a thickness of a portion of the first functional layer at the level-differential region, and a is the target gradient angle of the first functional layer.

Figure 16:
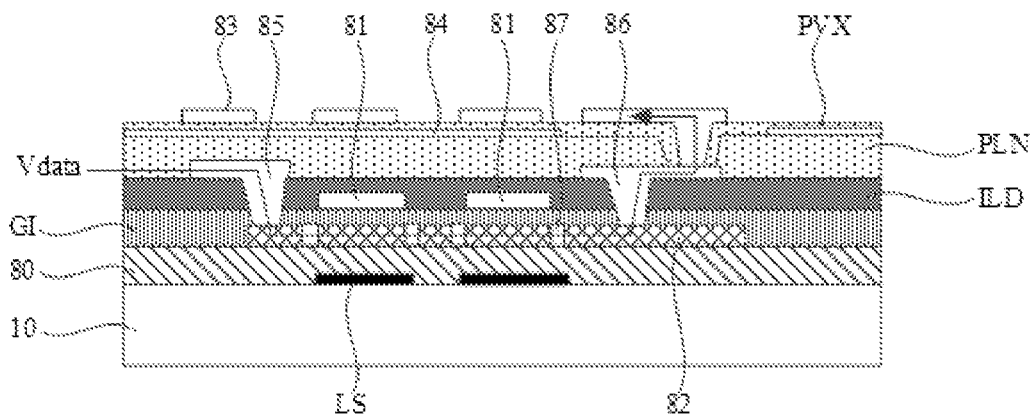
FIG. 16 is still yet another sectional view of the array substrate according to one embodiment of the present disclosure.

To be specific, FIG. 16 shows a Low Temperature Polysilicon Thin Film Transistor (LTPS TFT) array substrate, which includes the base substrate 10, a light-shielding layer LS, a buffer layer 80, an active layer 82, a gate electrode 81, a gate insulation layer GI, an interlayer insulation layer ILD, a planarization layer PLN, an input electrode 85, an output electrode 86, a cathode layer 84, an anode 83, and an LDD lightly-doped region 87. The active layer may be made of P—Si. As shown in FIG. 16, a data signal Vdata is transmitted to the anode through a TFT.

At least 10 masking processes may be performed during the manufacture of the LTPS TFT array substrate, and details will be given as follows.

In a first masking process, the light-shielding layer LS may be formed. To be specific, the base substrate 10 may be pre-cleaned, and then pre-compressed at a high temperature, so as to prevent the base substrate 10 (e.g., a glass substrate) from shrinking due to a subsequent high-temperature process, thereby to prevent the occurrence of an alignment offset. Next, a light-shielding material layer may be deposited on the base substrate. Next, a photoresist layer may be applied to a surface of the light-shielding material layer away from the base substrate, and then exposed and developed. Then, the light-shielding material layer may be etched through a wet-etching process with the remaining photoresist layer as a mask. Finally, the remaining photoresist may be removed, so as to form the light-shielding layer LS.

In a second masking process, the active layer 82 may be formed. To be specific, a cleaning process (D/C clean) and a multi-layer deposition process (multi-dep) may be performed sequentially. Next, a dehydrogenation process, a cleaning process with a hydrofluoric acid (D/C HF) and an Excimer Laser Annealing (ELA) process may be performed sequentially. Next, a photoresist layer may be applied to a surface of a poly-silicon layer, and then exposed and developed. Next, the poly-silicon layer may be etched through a dry-etching process with the remaining photoresist layer as a mask, and then the remaining photoresist layer may be removed. Next, a doping process for adjusting an eigenstate of a channel region and thereby adjusting a threshold voltage (Vth) (i.e., Vth doping) and a cleaning process with a hydrofluoric acid may be performed. Finally, the gate insulation layer may be formed through chemical vapor deposition.

In a third masking process and a fourth masking process, two gate electrodes 81 may be formed. One of the gate electrodes 81 (corresponding to a P-channel Metal Oxide Semiconductor (PMOS) transistor) may be formed in the third masking process. To be specific, a cleaning process may be performed, and a sputtering process with Mo may be performed to form a Mo thin film. Next, the Mo thin film may be pattern through such processes as forming, exposing, developing and removing a photoresist layer. Finally, a positive ion doping process (P+ doping) may be performed to form a P-gate. The other gate electrode 81 (corresponding to N-channel Metal Oxide Semiconductor (NMOS) transistor) may be formed in the fourth masking process. To be specific, a patterning process may be performed continuously, and then a negative ion doping process (N+ doping), an ashing process, a dry-etching process, a lightly-doping process, an ashing process and a removing process may be performed to form an N-gate.

In a fifth masking process, a contact layer may be formed. To be specific, a cleaning process may be performed at first, and then the interlayer insulation layer ILD may be formed through chemical vapor deposition. Next, a pre-cleaning process may be performed. Then, an activation process, a hydrogenation process, a source-drain layer photoetching process (S/D photo), a dry-etching process, and a removing process may be performed.

In a sixth masking process, the input electrode 85 and the output electrode 86 may be formed. To be specific, a Ti/Al/Ti composite metal layer may be formed through etching and sputtering. Next, patterning processes may be performed on the composite metal layer, and the patterning processes may include in turn a photoresist layer formation process, an exposing process, a developing process, a dry-etching process, and a removing process for removing the remaining photoresist layer. Finally, an annealing process may be performed.

In a seventh masking process, a via-hole for connecting the anode 83 and the output electrode 86 may be formed. To be specific, the planarization layer PLN may be formed through a coating process using an acrylic resin. Next, a patterning process may be performed on the PLN to form the via-hole for exposing the output electrode 86. Finally, a curing process may be performed.

In an eighth masking process, the cathode layer 84 may be formed. To be specific, a descum process may be performed, and then a cleaning process may be performed. Next, patterning processes may be performed on an indium tin oxide (ITO) film layer, and the patterning processes may include in turn a photoresist layer formation process, an exposing process, a developing process, a wet-etching process, and a removing process for removing the remaining photoresist layer, so as to form the cathode layer 84.

In a ninth masking process, a passivation layer PVX may be formed. To be specific, a cleaning process may be performed, and then the passivation layer may be formed through chemical vapor deposition. Next, patterning processes may be performed on the passivation layer, and the patterning processes may include in turn a photoresist layer formation process, an exposing process, a developing process, a wet-etching process, and a removing process for removing the remaining photoresist layer, so as to form the passivation layer PVX with a via-hole for exposing the output electrode 86.

In a tenth masking process, the anode 83 may be formed. To be specific, a cleaning process may be performed, and then an ITO film layer may be formed through sputtering. Next, patterning processes may be performed on the ITO film layer, and the patterning processes may include in turn a photoresist layer formation process, an exposing process, a developing process, an ashing process, a wet-etching process, and a removing process for removing the remaining photoresist layer. Finally, an annealing process may be performed, so as to form the anode 83.

After the manufacture of the array substrate, the array substrate may be tested before leaving the factory.

To be specific, FIGS. 17 to 30 show a procedure of manufacturing the OLED array substrate. The specific procedure will be described hereinafter.

Figure 17:
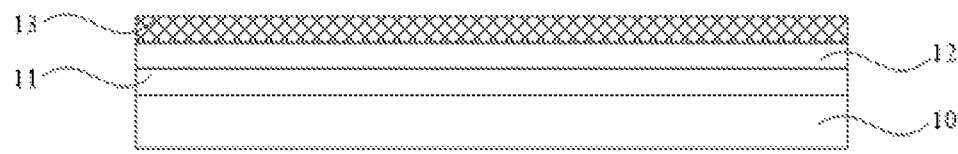
FIG. 17 is a schematic view showing the formation of a buffer layer on a base substrate according to one embodiment of the present disclosure.

As shown in FIG. 17, a first buffer layer 11 and a second buffer layer 12 may be formed sequentially on the base substrate 10 through Plasma-Enhanced Chemical Vapor Deposition (PECVD). The first buffer layer 11 may be made of SiNx and have a thickness of 600 Å. The second buffer layer 12 may be made of SiOx and have a thickness of 2000 Å.

Figure 18:
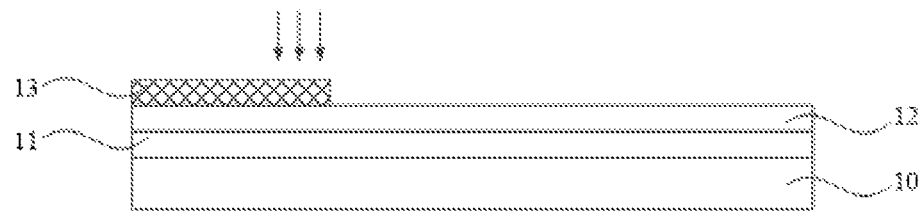
FIG. 18 is a schematic view showing a laser annealing process on an active thin film according to one embodiment of the present disclosure.
Figure 19:
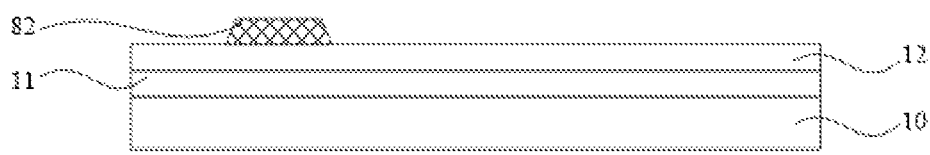
FIG. 19 is a schematic view showing the formation of an active layer according to one embodiment of the present disclosure.

As shown in FIGS. 18 and 19, the active layer may be formed. To be specific, after an initial cleaning process, an amorphous silicon (a-Si) material may be deposited on a surface of the second buffer layer 12 away from the base substrate through PECVD, so as to form an active thin film 13. Next, a pre-cleaning process may be performed, and then an ELA process and a photoetching process may be performed, so as to form the active layer 82 made of a poly-silicon material. The active layer 82 may have a thickness of 347 Å.

Figure 20:
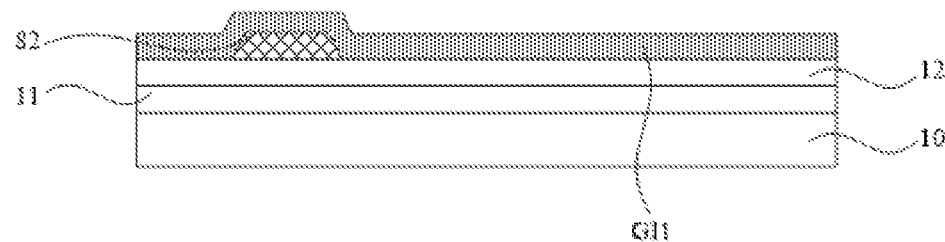
FIG. 20 is a schematic view showing the formation of a first gate insulation layer according to one embodiment of the present disclosure.

As shown in FIG. 20, a SiOx material may be deposited through PECVD to form the first gate insulation layer GI1 having a thickness of 694 Å.

Figure 21:
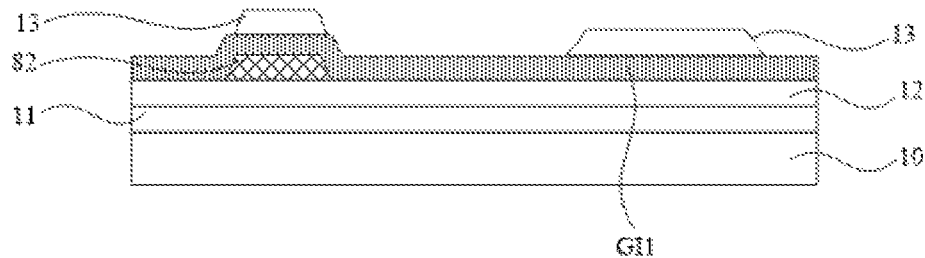
FIG. 21 is a schematic view showing the formation of a first gate metal pattern according to one embodiment of the present disclosure.

As shown in FIG. 21, a Mo thin film may be formed through a sputtering process, and then patterning processes may be performed on the Mo thin film. The patterning processes may include a photoresist layer formation process, an exposing process, a developing process and a removing process. Finally, an ion doping process may be performed to form the first gate metal pattern 13 having a thickness of 2270 Å.

Figure 22:
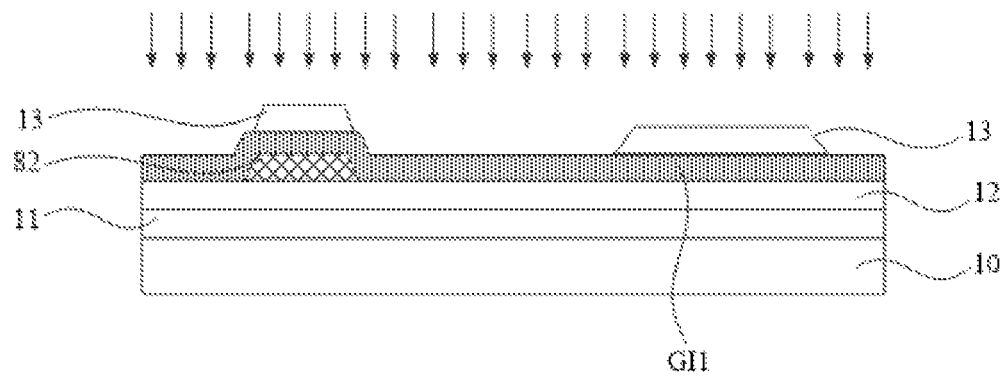
FIG. 22 is a schematic view showing a heavy-doping process according to one embodiment of the present disclosure.

As shown in FIG. 22, a heavy-doping process (B2H6 Heavy Doping) may be performed.

Figure 23:
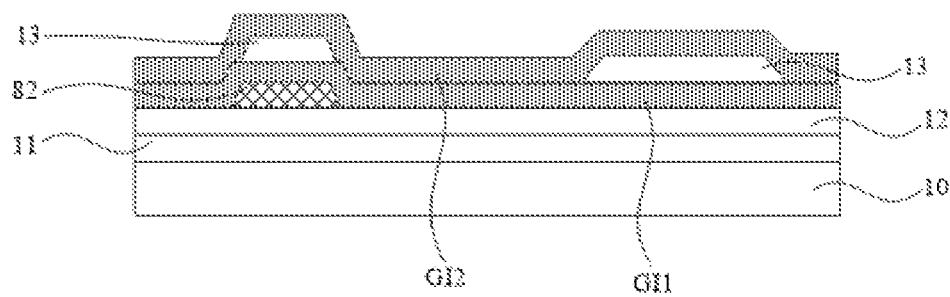
FIG. 23 is a schematic view showing the formation of a second gate insulation layer according to one embodiment of the present disclosure.

As shown in FIG. 23, a SiNx material may be deposited through PECVD to form the second gate insulation layer GI2 having a thickness of 1130 Å.

Figure 24:
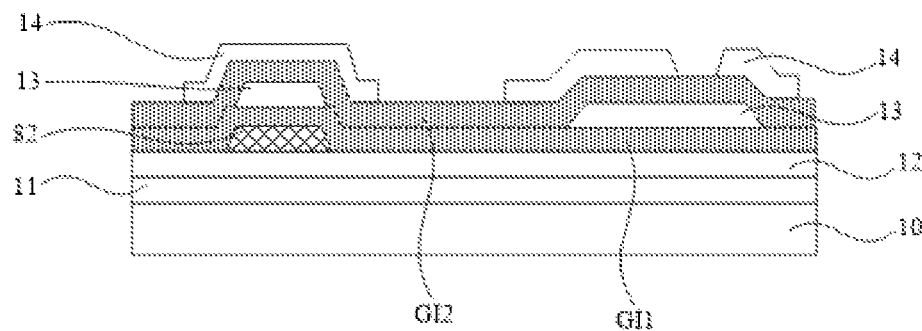
FIG. 24 is a schematic view showing the formation of a second gate metal pattern according to one embodiment of the present disclosure.

As shown in FIG. 24, a Mo thin film may be formed through a sputtering process, and then patterning processes may be performed on the Mo thin film. The patterning processes may include a photoresist layer formation process, an exposing process, a developing process and a removing process. Finally, an ion doping process may be performed to form the second gate metal pattern 14 having a thickness of 2270 Å and a via-hole penetrating through the second gate metal pattern 14.

Figure 25:
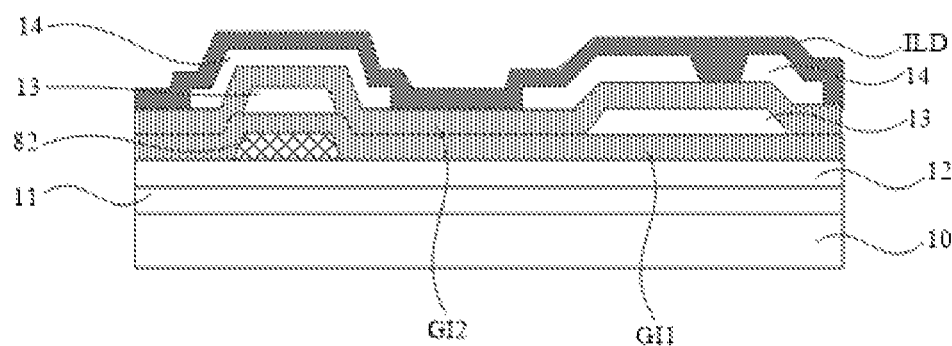
FIG. 25 is a schematic view showing the formation of an interlayer insulation layer according to one embodiment of the present disclosure.

As shown in FIG. 25, a SiOx material may be deposited through PECVD to form the interlayer insulation layer ILD having a thickness of 3570 Å.

Figure 26:
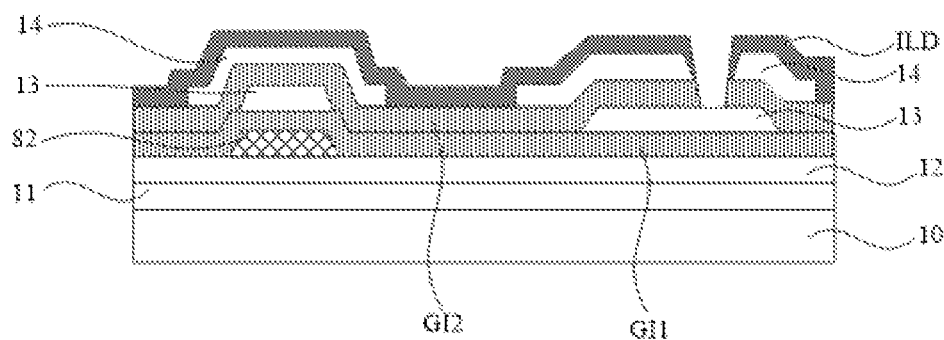
FIG. 26 is a schematic view showing the formation of a via-hole according to one embodiment of the present disclosure.

As shown in FIG. 26, a via-hole penetrating through the first gate insulation layer GIL the second gate insulation layer GI2 and the interlayer insulation layer ILD may be formed through a photoetching process, so as to expose a part of the first gate metal pattern 13.

Figure 27:
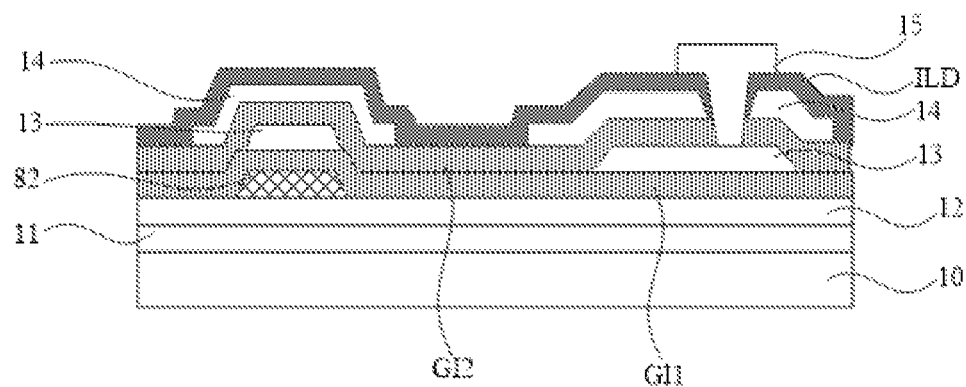
FIG. 27 is a schematic view showing the formation of a source-drain metal pattern according to one embodiment of the present disclosure.

As shown in FIG. 27, a Ti/Al/Ti thin film may be formed through a sputtering process. A Ti thin film may have a thickness of 550 Å, an Al thin film may have a thickness of 3500 Å. Then, a patterning process may be performed on the Ti/Al/Ti thin film to form the source-drain metal pattern 15 in the via-hole.

Figure 28:
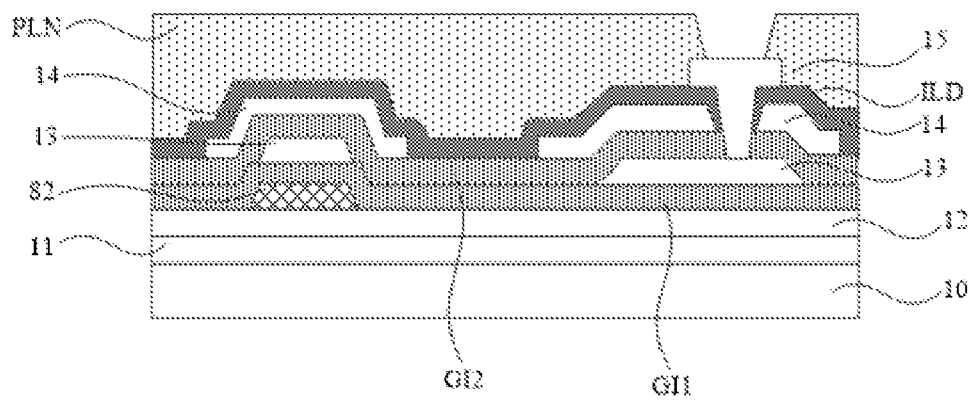
FIG. 28 is a schematic view showing the formation of a planarization layer according to one embodiment of the present disclosure.

As shown in FIG. 28, the planarization layer PLN having a thickness of 15000 Å may be formed using an organic material, and then a patterning process may be performed on the planarization layer to form a via-hole for exposing the source-drain metal pattern 15.

Figure 29:
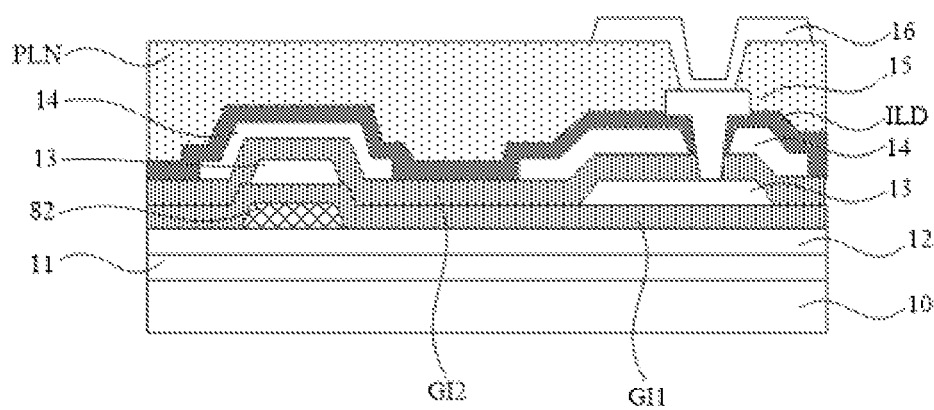
FIG. 29 is a schematic view showing the formation of an anode pattern according to one embodiment of the present disclosure.

As shown in FIG. 29, an ITO/Ag/ITO thin film may be formed through a sputtering process, An ITO thin film may have a thickness of 60 Å, and an Ag thin film may have a thickness of 1000 Å. Then, a patterning process may be performed on the ITO/Ag/ITO thin film to form an anode pattern 15 in the via-hole.

Figure 30:
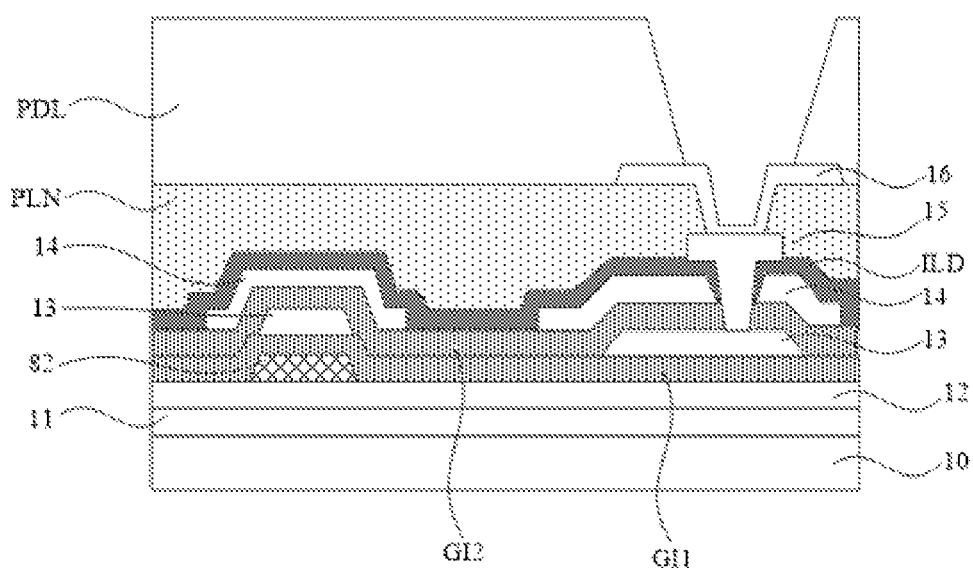
FIG. 30 is a schematic view showing the formation of a pixel definition layer according to one embodiment of the present disclosure.

As shown in FIG. 30, a pixel definition layer PDL having a thickness of 15000 Å may be formed using an organic material, and then a patterning process may be performed on the pixel definition layer PDL, so as to form a pixel aperture for exposing a part of the anode pattern 15.

In the array substrate manufactured using the method in the embodiments of the present disclosure, the portion of the first functional layer 20 at the level-different region may be provided with the target gradient angle, the target gradient angle may be a maximum gradient angle when the second functional layer has the predetermined thickness, and the predetermined thickness may be a thickness when the functional requirement of the second functional layer itself has been met and the second functional layer is not broken at the level-different region. In this regard, it is able to, while providing the first functional layer 20 with a maximum gradient angle, provide the second functional layer 30 with a minimum thickness when the functional requirement of the second functional layer 30 has been met and the second functional layer 30 is not broken at the level-different region. As a result, in the case of ensuring that the functional layer is not broken, it is able to provide the thinnest second functional layer 30 with a maximum gradient angle, thereby to apply the array substrate to a thin and high-resolution display product, improve the yield of the array substrate, and reduce the material cost.

It should be further appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising a base substrate, and a first functional layer and a second functional layer laminated one on another on the base substrate, wherein
the first functional layer forms a level-different region on the base substrate, and the second functional layer covers the level-different region;
a portion of the first functional layer at the level-different region is provided with a target gradient angle, the target gradient angle is a maximum gradient angle when the second functional layer has a predetermined thickness, and the predetermined thickness is a thickness when a functional requirement of the second functional layer has been met and the second functional layer is not broken at the level-different region; and
the target gradient angle of the first functional layer and the predetermined thickness of the second functional layer meet $\mathrm{Tan}(a)-1 \leq N(x-y)/y \leq \mathrm{Tan}(a)+1$, where $N=z \times W \times KIC$, $z$ is a constant, $W$ is a predetermined value, KIC is a fracture toughness parameter of the second functional layer, $x$ is the predetermined thickness of the second functional layer, $y$ is a thickness of a portion of the first functional layer at the level-differential region, and a is the target gradient angle of the first functional layer, the first functional layer comprises a first functional pattern, and the first functional pattern forms a first level-different region on the base substrate;

the second functional layer comprises a first functional film layer and a second functional film layer, the first functional film layer is arranged at a side of the first functional pattern away from the base substrate, the second functional film layer is arranged at a side of the first functional film layer away from the base substrate, the first functional film layer and the second functional film layer both cover the first level-different region, and the first functional film layer has a fracture toughness parameter approximately same as the second functional film layer;

each of the first functional film layer and the second functional film layer has a uniform thickness; and a portion of the first functional pattern at the first level-different region is provided with a first target gradient angle, the first target gradient angle is a maximum gradient angle when each of the first functional film layer and the second functional film layer has a first predetermined thickness, and the first predetermined thickness is a sum of the thickness of the first functional film layer and the thickness of the second functional film layer when a functional requirement of each of the first functional film layer and the second functional film layer has been met and each of the first functional film layer and the second functional film layer is not broken at the first level-different region.

2. The array substrate according to claim 1, wherein the first functional layer further comprises a second functional pattern arranged at a same layer and made of a same material as the first functional pattern, the second functional pattern forms a second level-different region;

the first functional film layer covers the second level-different region;

a portion of the second functional pattern at the second level-different region is provided with a second target gradient angle, the second target gradient angle is a maximum gradient angle when the first functional film layer has a second predetermined thickness;

the second predetermined thickness is a thickness when a functional requirement of the first functional film layer has been met and the first functional film layer is not broken at the second level-different region; and the second target gradient angle is smaller than the first target gradient angle.

3. The array substrate according to claim 2, wherein the first functional layer further comprises a third functional pattern arranged at a side of the first functional film layer away from the base substrate, the third functional pattern forms a third level-different region on the base substrate;

the second functional film layer covers the third level-different region;

a portion of the third functional pattern at the third level-different region is provided with a third target gradient angle, the third target gradient angle is a maximum gradient angle when the second functional film layer has a third predetermined thickness, the third predetermined thickness is a thickness when a functional requirement of the second functional film layer has been met and the second functional film layer is not broken at the third level-different region; and the third target gradient angle is greater than the second target gradient angle and smaller than the first target gradient angle.

4. The array substrate according to claim 1, wherein the first functional layer comprises a fourth functional pattern, and the fourth functional pattern forms at least two fourth level-different regions arranged sequentially on the base substrate in a direction away from the base substrate;

the second functional layer comprises a planarization layer arranged at a side of the fourth functional pattern away from the base substrate and covering the entire fourth functional pattern; and a portion of the fourth functional pattern at each fourth level-different region is provided with a fourth target gradient angle, the fourth target gradient angle is a maximum gradient angle when a first portion of the planarization layer at the fourth level-different region corresponding to the fourth target gradient angle has a fourth predetermined thickness, the fourth predetermined thickness is a minimum thickness when a functional requirement of the first portion has been met and the first portion is not broken at the fourth level-different region.

5. The array substrate according to claim 4, wherein the first functional layer comprises a first functional pattern, and the first functional pattern forms a first level-different region on the base substrate;

the second functional layer comprises a first functional film layer and a second functional film layer, the first functional film layer is arranged at a side of the first functional pattern away from the base substrate, the second functional film layer is arranged at a side of the first functional film layer away from the base substrate, and the first functional film layer and the second functional film layer both cover the first level-different region; and the fourth functional pattern is arranged at a side of the second functional film layer away from the base substrate and covers the first level-different region.

6. The array substrate according to claim 4, wherein the planarization layer comprises a first planarization layer and a second planarization layer, the first functional layer further comprises another fourth functional pattern arranged at a side of the first planarization layer away from the base substrate and forming another fourth level-different region on the base substrate, a portion of the other fourth functional pattern at the other fourth level-different region is provided with another fourth target gradient angle, and the second planarization layer covers the other fourth functional pattern.

7. The array substrate according to claim 1, wherein the first functional layer comprises a fifth functional pattern and a sixth functional pattern laminated one on another in the direction away from the base substrate;

the second functional layer comprises a second functional film layer arranged between the fifth functional pattern and the sixth functional pattern, and a planarization layer arranged at a side of the sixth functional pattern away from the base substrate; wherein the second functional film layer is provided with a first via-hole and forms a fifth level-different region at an edge of the first via-hole;

a portion of the second functional film layer at the fifth level-different region is provided with a fifth target gradient angle;

the sixth functional pattern is coupled to the fifth functional pattern through the first via-hole, covers the fifth level-different region, and forms a sixth level-different region at a position corresponding to the fifth level-different region;

a portion of the sixth functional pattern at the sixth level-different region is provided with a sixth target gradient angle, the sixth target gradient angle is a maximum gradient angle when a second portion of the planarization layer at the sixth level-different region has a sixth predetermined thickness, and the sixth predetermined thickness is a minimum thickness when a functional requirement of the second portion has been met and the second portion is not broken at the sixth level-different region; and the fifth target gradient angle is approximately equal to the sixth target gradient angle.

8. The array substrate according to claim 1, wherein the first functional layer comprises:

a seventh functional pattern arranged on the base substrate and forming a seventh level-different region on the base substrate;

an eighth functional pattern arranged at a side of the seventh functional pattern away from the base substrate, and comprising a third portion covering the seventh level-different region, a fourth portion covering the seventh functional pattern other than the seventh level-different region, and a fifth portion not covering the seventh functional pattern; and a planarization layer arranged at a side of the eighth functional pattern away from the base substrate and provided with a second via-hole, wherein an orthogonal projection of the second via-hole onto the base substrate is located within an orthogonal projection of the eighth functional pattern onto the base substrate, the planarization layer forms an eighth level-different region and a ninth level-different region at an edge of the second via-hole, an orthogonal projection of the eighth level-different region onto the base substrate overlaps an orthogonal projection of the fourth portion onto the base substrate, and an orthogonal projection of the ninth level-different region onto the base substrate overlaps an orthogonal projection of the fifth portion onto the base substrate;

the second functional layer comprises a second functional film layer and a ninth functional pattern, the second functional film layer is arranged between the seventh functional pattern and the eighth functional pattern, the ninth functional pattern is arranged at a side of the planarization layer away from the base substrate and coupled to the eighth functional pattern through the second via-hole, and the ninth functional pattern covers the eighth level-different region and the ninth level-different region and has a uniform thickness;

a portion of the planarization layer at the eighth level-different region is provided with an eighth target gradient angle, the eighth target gradient angle is a maximum gradient angle when the ninth functional pattern has an eighth predetermined thickness, and the eighth predetermined thickness is a thickness when a functional requirement of the ninth functional pattern has been met and the ninth functional pattern is not broken at the eighth level-different region; and a portion of the planarization layer at the ninth level-different region is provided with a ninth target gradient angle, the ninth target gradient angle is a maximum gradient angle when the ninth functional pattern has a ninth predetermined thickness, and the ninth predetermined thickness is a thickness when a functional requirement of the ninth functional pattern has been met and the ninth functional pattern is not broken at the ninth level-different region.

9. The array substrate according to claim 8, wherein an orthogonal projection of the seventh functional pattern onto the base substrate overlaps an orthogonal projection of the eighth functional pattern onto the base substrate at a first overlapping region, the first overlapping region has a first size in a first direction;

a portion of the eighth functional pattern not at the first overlapping region has a second size in the first direction;

the ninth functional pattern and the eighth functional pattern form a first contact region, a minimum distance between a boundary of the first contact region and a first end of the eighth functional pattern in the first direction is a first interval, a minimum distance between the boundary of the first contact region and a second end of the eighth functional pattern is a second interval, the first end is arranged opposite to the second end in the first direction, an orthogonal projection of the first end onto the base substrate overlaps the seventh functional pattern, and an orthogonal projection of the second end onto the base substrate does not overlap the seventh functional pattern; and a first absolute value corresponding to a difference between the first size and the second size is in direct proportion to a second absolute value corresponding a difference between the first interval and the second interval.

10. The array substrate according to claim 9, wherein the second absolute value corresponding to the difference between the first interval and the second interval is in direct proportion to a ratio of the first interval to a first width of the eighth functional pattern in the first direction.

11. The array substrate according to claim 9, wherein when the first size is greater than the first interval, the eighth target gradient angle is greater than the ninth target gradient angle, or a difference between the eighth target gradient angle to the ninth target gradient angle is in direct proportion to the first size.

12. The array substrate according to claim 9, wherein a difference between the eighth target gradient angle and the ninth target gradient angle is smaller than a seventh target gradient angle of the seventh functional pattern at the seventh level-different region, the seventh target gradient angle is a maximum gradient angle when the second functional film layer has a seventh predetermined thickness, and the seventh predetermined thickness is a thickness when a functional requirement of the second functional film layer has been met and the second functional film layer is not broken at the seventh level-different region.

13. The array substrate according to claim 1, comprising a capacitor structure, wherein the first functional layer comprises a first electrode plate of the capacitor structure, and the first electrode plate forms an electrode plate level-different region on the base substrate;

the second functional layer comprises a dielectric layer arranged at a side of the first electrode plate away from the base substrate and covering the entire first electrode plate; a portion of the first electrode plate at the electrode plate level-different region is provided with an electrode plate target gradient angle, the electrode plate target gradient angle is a maximum gradient angle when the dielectric layer has a tenth predetermined thickness, and the tenth predetermined thickness is a thickness when a functional requirement of the dielectric layer has been met and the dielectric layer is not broken at the electrode plate level-different region; and a second electrode plate of the capacitor structure is arranged at a side of the dielectric layer away from the base substrate, an orthogonal projection of the second electrode plate onto the base substrate overlaps an orthogonal projection of the first electrode plate onto the base substrate at a first overlapping region, and the second electrode plate covers the electrode plate level-different region.

14. The array substrate according to claim 13, wherein the capacitor structure comprises a first capacitor structure, a second capacitor structure and a third capacitor structure, and a capacitance of the first capacitor structure is greater than a capacitance of the second capacitor structure and/or greater than a capacitance of the third capacitor structure; and an electrode plate target gradient angle corresponding to a first electrode plate of the first capacitor structure is greater than an electrode plate target gradient angle corresponding to a first electrode plate of the second capacitor structure, and/or greater than an electrode plate target gradient angle corresponding to a first electrode plate of the third capacitor structure.

15. The array substrate according to claim 14, wherein a thickness of a first dielectric layer corresponding to the first capacitor structure is smaller than a thickness of a second dielectric layer corresponding to the second capacitor structure, and/or the thickness of the first dielectric layer corresponding to the first capacitor structure is smaller than a thickness of a third dielectric layer corresponding to the third capacitor structure.

16. The array substrate according to claim 14, wherein a gradient angle of a portion of a second electrode plate of the first capacitor structure at the corresponding first overlapping region is greater than a gradient angle of a portion of the second electrode plate of the second capacitor structure at the corresponding first overlapping region, and/or the gradient angle of the portion of the second electrode plate of the first capacitor structure at the corresponding first overlapping region is greater than a gradient angle of a portion of a second electrode plate of the third capacitor structure at the corresponding first overlapping region.

17. The array substrate according to claim 1, wherein the first functional layer comprises a composite metal pattern, the composite metal pattern comprises a first metal sub-pattern, a second metal sub-pattern and a third metal sub-pattern laminated one on another in the direction away from the base substrate, and the first metal sub-pattern is made of a same material as the third metal sub-pattern; and the target gradient angle of the first functional layer is in reverse proportion to an etching rate of the third metal sub-pattern when forming the first functional layer through etching.

18. A display device, comprising the array substrate according to claim 1.

19. A method for manufacturing the array substrate according to claim 1, comprising;

forming a first functional layer on a base substrate, the first functional layer forming a level-different region on the base substrate, and a portion of the first functional layer at the level-different region being provided with a target gradient angle; and forming a second functional layer at a side of the first functional layer away from the base substrate, the second functional layer covering the level-different region, wherein the target gradient angle is a maximum gradient angle when the second functional layer has a predetermined thickness, and the predetermined thickness is a thickness when a functional requirement of the second functional layer has been met and the second functional layer is not broken at the level-different region; and the target gradient angle of the first functional layer and the predetermined thickness of the second functional layer meet $Tan(a)-1 \leq N(x-y)/y \leq Tan(a)+1$, where $N=z \times W \times K_{IC}$, z is a constant, W is a predetermined value, $K_{IC}$ is a fracture toughness parameter of the second functional layer, x is the predetermined thickness of the second functional layer, y is a thickness of a portion of the first functional layer at the level-differential region, and a is the target gradient angle of the first functional layer.

20. An array substrate, comprising a base substrate, and a first functional layer and a second functional layer laminated one on another on the base substrate, wherein the first functional layer forms a level-different region on the base substrate, and the second functional layer covers the level-different region;

a portion of the first functional layer at the level-different region is provided with a target gradient angle, the target gradient angle is a maximum gradient angle when the second functional layer has a predetermined thickness, and the predetermined thickness is a thickness when a functional requirement of the second functional layer has been met and the second functional layer is not broken at the level-different region; and the target gradient angle of the first functional layer and the predetermined thickness of the second functional layer meet $Tan(a)-1 \leq N(x-y)/y \leq Tan(a)+1$, where $N=z \times W \times KIC$, z is a constant, W is a predetermined value, $K_{IC}$ is a fracture toughness parameter of the second functional layer, x is the predetermined thickness of the second functional layer, y is a thickness of a portion of the first functional layer at the level-differential region, and a is the target gradient angle of the first functional layer, the first functional layer comprises a fourth functional pattern, and the fourth functional pattern forms at least two fourth level-different regions arranged sequentially on the base substrate in a direction away from the base substrate;

the second functional layer comprises a planarization layer arranged at a side of the fourth functional pattern away from the base substrate and covering the entire fourth functional pattern; and a portion of the fourth functional pattern at each fourth level-different region is provided with a fourth target gradient angle, the fourth target gradient angle is a maximum gradient angle when a first portion of the planarization layer at the fourth level-different region corresponding to the fourth target gradient angle has a fourth predetermined thickness, the fourth predetermined thickness is a minimum thickness when a functional requirement of the first portion has been met and the first portion is not broken at the fourth level-different region.

\* \* \* \* \*